United States Patent [19]
Sato et al.

[11] Patent Number: 5,798,566
[45] Date of Patent: Aug. 25, 1998

[54] CERAMIC IC PACKAGE BASE AND CERAMIC COVER

[75] Inventors: Kazuhisa Sato, Konan; Masanori Kitou, Inuyama; Hisashi Wakako; Kazuo Kimura, both of Komaki, all of Japan

[73] Assignee: NGK Spark Plug Co., Ltd., Nagoya, Japan

[21] Appl. No.: 976,501

[22] Filed: Nov. 24, 1997

Related U.S. Application Data

[63] Continuation of Ser. No. 584,277, Jan. 11, 1996, abandoned.

[51] Int. Cl.$^6$ .................... H01L 23/34; H01L 23/06; H01L 23/15; H01L 23/10
[52] U.S. Cl. .................... 257/712; 257/703; 257/705; 257/706
[58] Field of Search .................... 257/712, 705, 257/706, 675, 703, 700; 361/701, 704, 709, 713, 688, 748, 749, 801

[56] References Cited

U.S. PATENT DOCUMENTS

| | | | |
|---|---|---|---|
| 4,123,293 | 10/1978 | Okikawa et al. | 257/712 |
| 4,680,618 | 7/1987 | Kuroda et al. | 257/746 |
| 5,216,279 | 6/1993 | Nakao | 257/703 |
| 5,448,107 | 9/1995 | Osada et al. | 257/706 |
| 5,451,817 | 9/1995 | Osada et al. | 257/712 |

FOREIGN PATENT DOCUMENTS

| | | | |
|---|---|---|---|
| 61-84043 | 4/1986 | Japan | 257/701 |
| 61-4250 | 10/1986 | Japan | 257/706 |
| 61-270850 | 12/1986 | Japan . | |
| 63-20449 | 2/1988 | Japan . | |
| 63-164237 | 10/1988 | Japan . | |
| 1-89350 | 3/1989 | Japan | 257/706 |
| 4-112557 | 4/1992 | Japan | 257/700 |
| 4-137658 | 12/1992 | Japan | 257/706 |
| 6-163766 | 10/1994 | Japan | 257/712 |

*Primary Examiner*—Mahshid D. Saadat
*Assistant Examiner*—Jhihan B. Clark
*Attorney, Agent, or Firm*—Foley & Lardner

[57] ABSTRACT

In accordance with the present invention, there is provided a ceramic IC package base which comprises a ceramic substrate, and a heat radiating member adhered to a side surface of the ceramic substrate and made of copper or copper alloy. The heat radiating member has an adhering portion at which it is adhered to the ceramic substrate. The adhering portion, when the heat radiating member is observed in a plan view, has one side which is equal to or larger than 8 mm. The adhering portion is of the thickness within the range from 0.25 mm to 0.76 mm. A ceramic IC package cover is also provided.

37 Claims, 13 Drawing Sheets

CERAMIC IC PACKAGE BASE AND CERAMIC COVER

This application is a continuation of application Ser. No. 08/584,277, filed Jan. 11, 1996, abandoned.

BACKGROUND OF THE INVENTION

1. Field of the Invention

The present invention relates to a ceramic package base for receiving therewithin or installing thereon an IC (integrated circuit) chip and a ceramic cover or lid for hermetically sealing the package. More specifically, the present invention relates to a ceramic IC package base and a ceramic cover which are suited for use for efficient radiation of heat generated by an IC chip.

2. Description of Related Art

A package base consisting of a ceramic substrate and a plurality of input/output terminals attached to the ceramic substrate has heretofore been used for receiving therewithin a semiconductor element such as a transistor. In order to radiate the heat generated by the semiconductor element, it has been used a structure in which a heat radiating member made of copper or the like is brazed or otherwise attached to a ceramic substrate by way of a metallized layer provided to the surface of the ceramic substrate or a structure in which a heat radiating tin or fins made of aluminum are further attached to the heat radiating member. Such a structure is also adopted for application to an IC package base for receiving therewithin an IC chip.

However, alumina ceramic used for forming the ceramic substrate has a coefficient of thermal expansion of about $7.8–8.5 \times 10^{-6}$/K, whereas copper used for forming the heat radiating member has a coefficient of thermal expansion of about $17 \times 10^{-6}$/K, so they largely differ in coefficient of thermal expansion from each other. Furthermore, the temperature which they are heated up to is so high, i.e., about 900° C., so the thermal stress caused by adhering the heat radiating member to the ceramic substrate becomes so large. That is, as the size of the heat radiating member adhered to the package base (i.e., the size of the adhering portion) becomes larger, the problem that a crack or cracks are caused in the ceramic portion or the like problem is more pronounced.

On the other hand, by the development of technology the integrated circuit is caused to become more dense in integration, so the integrated circuit chip is caused to become further larger whilst the calorific value becomes larger, thus increasing the necessity of heat radiation.

Accordingly, a ceramic package base having a highly reliable heat radiating member has come to be required. For achieving thus end, Cu-W or Cu-Mo or the like which approximates in coefficient of thermal expansion to alumina ceramic has come to be used for forming the heat radiating member in place of copper.

Cu-W or the like is controllable about its coefficient of thermal expansion through control of its component and the coefficient of thermal expansion of typical one is about $6.5 \times 10^{-6}$/K, so Cu-W can be approximated in coefficient of thermal expansion to ceramic such as alumina. Further, Cu-W has a thermal conductivity that is sufficiently large, though smaller than copper, so that it can be used successfully for forming a heat radiating member.

Thus, in the case where the heat radiating member is of the kind for use in a ceramic IC package base and its adhering portion has one side which is equal to or larger than about 8 mm (0.31 inches), it has come not to use copper but Cu-W or the like. This is because it is known from experience that when copper is used for forming the heat radiating member exceeding the above described size a crack or cracks are caused in the ceramic portion, thus lowering the yield and the reliability.

Particularly, in the case of a ceramic package base of the kind in which a ceramic substrate is formed with a rectangular recess or opening having stepped side surfaces and an IC chip is attached (die-attached) to the base of the recess, there has been a problem that a crack or cracks are caused in the bottom surface, the side surfaces and the upper surface of the stepped side wall portion of the recess or the four corners of the opening. This is considered, when consideration is made by simplification, due to the fact that since the heat radiating member is larger in coefficient of thermal expansion than the ceramic substrate stresses are caused to act upon them in such a manner as to bend them like a bimetal, i.e., in the direction to expanding the open end of the recess, causing stress concentration at the bottom surface, the side surfaces and the upper surface of the stepped side wall portion of the recess or the four corners of the opening to cause a crack or cracks thereat. Such stress concentration is of the kind which is not caused in the case where a planar ceramic substrate is used for the package base. Further, in the case where the ceramic substrate is formed with a through hole and a heat radiating member is attached to the ceramic substrate in such a manner as to close the through hole, a similar stress described as above is caused.

For the sake of such a problem, it has been believed that only Cu-W, Cu-Mo or the like is a material for a heat radiating member for use in an IC package base, and therefor in order to meet with the required heat radiating characteristics there is nothing to do for it but to change the component of Cu-W or the like or to adjust the size of the heat radiating member.

Accordingly, in the case of adherence of a heat radiating member to a ceramic package base of the kind which is adapted to receive on the bottom surface of the recess thereof a large-sized IC chip of 10.2 mm (0.4 inches) square, the heat radiating member essentially becomes larger, so it has been practiced to use a heat radiating member made of Cu-W or Cu-Mo without exception.

Particularly, in the case of a ceramic package base in which an IC chip such as CPU (central processing unit) which is large-sized and furthermore generates a large amount of heat, the package base will be, for example, 51 mm (2 inches) square in outside dimension and the heat radiating member of the heat spreader type will be 38 mm (1.5 inches) square in outside dimension. Thus, the package base and the heat radiating member are caused to become large-sized and furthermore required to have a considerably high durability and reliability. For this reason, Cu-W or Cu-Mo has been used as a heat radiating member without exception.

In the meantime, Cu-W, etc. are manufactured by a powder metallurgical technique and mostly by an infiltration method of that technique.

However, this manufacturing method is difficult and costly and furthermore has a difficulty in being formed into a desired shape so that it requires, after an article is formed into a rough shape, a process tar forming the article into a desired shape. Furthermore, this material has a difficulty in machining in itself, so it is a very expensive material for a heat radiating member. In some case, an article made of Cu-W or the like may be twenty times or more than twenty times higher in cost as compared with an article which is of the same shame and made of copper.

Accordingly, there may occur such a case in which the material cost of a heat radiating member made of Cu-W reach tens percentages of the total cost of a ceramic package base, so reduction of the cost of the heat radiating member is strongly desired.

On the other hand, in order to solve such a problem, it has been proposed to use a cladding material or the like which is produced by sandwiching kovar (Fe-Ni-Co alloy), invar or the like which is low in coefficient of thermal expansion between copper or copper alloy, for a heat spreader as disclosed in Japanese utility model provisional publication No. 63-20449. Further, it has also been proposed to use a sintered alloy However, these materials have a problem that they are still expensive though not so expensive as Cu-W, etc., so it is necessary to examine the thicknesses of copper and kovar or the like in order to set the coefficient of thermal expansion to a suitable value, and it is necessary to have a balance between a desired thermal conductivity and coefficient of thermal expansion since the thermal conductivity is lowered when the thickness of kovar or the like is increased with a view to making lower the coefficient of thermal expansion, so they have not been used so much.

Further, it has been proposed to adhere a thin copper plate to a package base to make it serve as a heat radiating member as disclosed in Japanese utility model provisional publication No. 63-164237. However, the thickness of the copper plate which is considered as being suited for adoption is so thin and there is not disclosed any investigated datum or any consideration thereon, so it has been impossible to manufacture a package base having a desired high reliability.

Further, besides the above described publications, it has been proposed to use a copper plate as a heat slug type heat radiating member as disclosed in Japanese patent provisional publication No. 61-270850. However, since there is not disclosed any examination on the thickness of the copper plate or any investigation or examination on the reliability, so such a heat radiating member cannot reduce the thermal stress sufficiently so as to attain a package base having a high reliability and therefore it has been impossible to overthrow the theory having heretofore been believed.

SUMMARY OF THE INVENTION

According to an aspect of the present invention, there is provided a ceramic IC package base which comprises a ceramic substrate, and a heat radiating member adhered to a side surface of the ceramic substrate and made of copper or copper alloy. The heat radiating member has an adhering portion at which it is adhered to the ceramic substrate. The adhering portion, when the heat radiating member is observed in a plan view, has one side which is equal to or larger than 8 mm, and the adhering portion is of the thickness within the range from 0.25 mm to 0.76 mm.

According to another aspect of the present invention there is provided a ceramic IC package base which comprises a ceramic substrate having an IC chip attaching portion, and a heat radiating member adhered to a rear surface of the ceramic substrate opposite to the IC chip attaching portion. The heat radiating member has an adhering portion at which it is adhered to the ceramic substrate. The heat radiating member is made of copper or copper alloy. The adhering portion, when the heat radiating member is observed in a plan view, has one side which a s equal to or larger than 8 mm, and the adhering portion is of the thickness within the range from 0.25 mm to 0.76 mm.

In this connection, in the case where the ceramic IC package base is of the type in which the ceramic substrate is formed with a recess and the bottom of the recess is used as an IC chip attaching portion, the stress concentration at the four corners of the recess formed by the bottom, etc. can be made sufficiently smaller, so application of this invention to this type of ceramic IC package base is particularly desirable.

According to a Further aspect of the present invention, there is provided a ceramic IC package base which comprises a ceramic substrate having a through hole, a heat radiating member adhered to a side surface of the ceramic substrate in such a manner as to close the through hole. The heat radiating member has an adhering portion at which it is adhered to a ceramic substrate. The heat radiating member is made of copper or copper alloy. The adhering portion, when the heat radiating member is observed in a plan view, has one side which is equal to or larger than 8 mm, and :he adhering portion is of the thickness within the range from 0.25 mm to 0.76 mm.

In the case where the material of the ceramic substrate has a coefficient of thermal expansion $\alpha$ which is given by $\alpha \leq 8.5 \times 10^{-6}/K$, the difference of thermal expansion between the ceramic substrate and the heat radiating member becomes so large. In such a case, the present invention makes it possible to obtain a highly reliable package base and therefore is desirable.

To illustrate this invention by a concrete example, in the case where the ceramic substrate is made of one or more kinds of ceramic materials selected from the group consisting of alumina, mullite, glass ceramic, aluminum nitride (AlN), silicon carbide (SiC), silicon nitride ($Si_3N_4$) and cordierite, the present invention makes it possible to attain a highly reliable package base and therefore is desirable.

Further, it is desirable to use the present invention in the case where the ceramic substrate has formed thereon a metallized layer, and the heat radiating member is adhered by brazing to the metallized layer, since the heat radiating member and the ceramic substrate are subjected to application of high heat and the difference in thermal expansion therebetween becomes large.

Further, it is desirable to use the present invention fin the case where the heat radiating member is directly adhered to the ceramic substrate by a DBC (Direct Bonding Copper) method.

According to a further aspect of the present invention, there is provided a ceramic IC package cover which comprises a ceramic substrate having an IC chip attaching portion, and a heat radiating member adhered to a rear surface of the ceramic substrate opposite to the IC chip attaching portion. The heat radiating member has an adhering portion at which it is adhered to the ceramic substrate. The heat radiating member is made of copper or copper alloy. The adhering portion, when the heat radiating member is observed in a plan view, has one side which is equal to or larger than 8 mm, and the adhering portion is of the thickness within the range from 0.25 mm to 0.76 mm. In the case of such a ceramic IC package cover, the present invention is suited for use for connecting an IC chip to the package base by a flip chip method and for radiating heat from the ceramic cover.

In general, the coefficient of thermal expansion of the ceramic material for use in the ceramic substrate is low, i.e., that of alumina is 7.3~8.5×10$^{-6}$/K, that of mullite is 4.1×10$^{-6}$/K, that of glass ceramic is 2.0~5.5×10$^{-6}$/K, that of aluminum nitride is 4.5×10$^{-6}$/K, that of cordierite is 3.0×10$^{-6}$/K, that of silicon carbide (SiC) is 3.7×10$^{-6}$/K, and that of silicon nitride (Si$_3$N$_4$) is about 3.5×10$^{-6}$/K.

On the other hand, the coefficient of thermal expansion of copper or copper alloy is about 17×10$^{-6}$/K, so it differs from that of the ceramic material by about more than two times.

Accordingly, in the case where the heat radiating member is adhered to the ceramic substrate by brazing or by use of a DBC (Direct Boding Copper) method, both are heated up to about 900° C., so thermal stresses are caused due to thermal expansion difference during a cooling step, thus causing residual stresses in the ceramic substrate at ordinary temperatures.

Further, it is supposed that the residual stresses become larger as the adhering area at which the ceramic substrate and the heat radiating member are adhered to each other, i.e., the size of the adhering portion becomes larger. It is considered that this is due to the fact that the difference of thermal expansion is proportional to the length of the adhering portions of two objects and the thermal stress is also proportional to the length of the adhering portions.

By the thermal expansion difference, stress concentration occurs at the joining portions of the ceramic substrate and the heat radiating member, particularly at an end of the joining portions, and in some cases a crack or cracks are caused in the ceramic substrate. Further, the shape of the ceramic substrate has an influence on the stresses caused therein. For example, since the materials of different coefficients of thermal expansion are joined as described above, such stresses are caused as to bend the ceramic substrate in its entirety. In this connection, in the case where the ceramic substrate is formed with a recess for installation of an IC chip, larger stress concentration occurs at the four corners formed by the bottom and the side surfaces, than that at the end of the joining portions of the ceramic substrate and the heat radiating member, thus being liable to cause a crack or cracks at those corner portions. This occurs similarly in the case where the ceramic substrate is formed with a through hole.

Accordingly, it has heretofore been believed impossible to use, in a ceramic package base of the kind in which a heat radiating member is attached to a large-sized ceramic substrate, particularly of the kind in which a ceramic substrate is formed with a recess, copper for forming a heat radiating member and thereby attaining a highly reliable ceramic package base.

(Sample Calculation 1-1)

In order to endorse the above argument, simulation (calculation) having been made by the applicants will be described hereinbelow.

It is assured that, as shown in FIG. 1, a package base 41 has a ceramic substrate 42, the ceramic substrate 42 has a recess 42a including a stepped side surface, the step side surface has a step which is 0.5 mm distant from the bottom of the recess 42a or from the upper surface of the ceramic substrate 42, the thickness (total thickness) of the peripheral portion 42b of the ceramic substrate 42 is 2 mm (0.79"), the thickness t of a heat radiating member (heat spreader) 45 is 2 mm (0.79"), and one side of the adhering portion of the heat radiating member 45 is of the size D (hereinafter referred to as "size of adhering portion" and in the sample calculation the adhering portion is of the size equal to the outside dimension of the heat radiating member). In this instance, by assuming that the outside dimension of the ceramic substrate 42 is 1.25 D, the bottom of the recess 42a, i.e., the IC package attaching portion 42c is 0.5 D in size and an opening end portion 42d is 0.56 D in size. By maintaining those ratios constantly, the distribution of residual stresses in the ceramic substrate at ordinary temperatures, in the case where the ceramic substrate and the heat radiating member are brazed together, are calculated by means of FEM (Finite Element Method). The result of the calculation is shown in FIG. 2. in this connection, the darker portion V indicates that the higher residual stresses are present thereat. As will be understood from FIG. 2, the maximum residual stress is caused at the four corners of the opening end portion 42d of the recess 42a as described above. The relation between the maximum residual stress and the size D of the adhering portion is represented by the graph of FIG. 3.

In this connection, the calculation is made by assuming that the package base 41 used for this calculation have a ceramic substrate 42 which is made of a ceramic material containing 92% alumina so the ceramic substrate has the coefficient of thermal expansion α of 7.6×10$^{-6}$/K, the coefficient of longitudinal elasticity E of 28000 kgf/mm$^2$ and the thermal conductivity λ of 18 W/m k, and by assuming that the heat radiating member is made of oxygen-free copper (OFHC, JIS-C1020) so the heat radiating member has the coefficient of thermal expansion α of 17.0×10$^{-6}$/K, the coefficient of longitudinal elasticity E of 12400 kgf/mm2 and the thermal conductivity λ of 390 w/m k.

From the graph of FIG. 3, it is seen that in the case where the size D of the adhering portion of the heat radiating member 45 is 4 mm (0.16") the maximum residual stress caused in the ceramic substrate 42 is relatively low, i.e., 14 kgf/mm$^2$. It is also seen that as the size D of the adhering portion of the heat radiating member 45 increases the maximum residual stress increases and then assumes a nearly constant value when the size D of the adhering portion becomes equal to about 16 mm. (0.63") or more.

In the meantime, the actual rupture strength (tensile strength) of alumina ceramic is about 20~30 kgf/mm$^2$. Accordingly, in the case where the maximum residual strength exceeds 20~30 kgf/mm$^2$, the package base will be broken and therefore cannot actually be produced, so even if it can be produced a crack or cracks will inevitably be caused in its ceramic substrate so that the package base cannot be practically used.

That is, as having been known heretofore, it is possible to use a copper plate having a certain thickness as a heat radiating member only when the size D of the adhering portion is within a range of small values. For example, as in the above described sample calculation, in the case where the heat radiating member made of copper and of the thickness of 2 mm is used, it is endorsed that breakage (crack or cracks) of the ceramic substrate is caused when the heat radiating member the size D of the adhering portion of which is equal to or larger than 8 mm (0.31") is adhered to the ceramic substrate. In this instance, the reason why the tensile strength is used to represent the rupture strength of the ceramic substrate, is that it is known that generally in ceramics the tensile strength is smallest of all factors representative of the rupture strength, then the bending strength and the compression strength are enumerated in the order of smaller rupture strength, and the Tensile strength is about ⅒ of the compression strength.

In the meantime, the thermal strength is caused at the joint between the ceramic substrate and the heat radiating member due to the fact that a high temperature adhering method such as brazing is employed for their joining. Thus, from the reason that the thermal stresses may be reduced if their adhering is carried out at low temperature, it is considered to employ soldering, or the like method. However, it is an ordinary practice not to use such a method.

This is because the package base is heated, after the process of adhering thereto the heat radiating member, for the purpose of adhering thereto an IC chip or for the purpose of being hermetically sealed by attaching thereto a package cover, so if the hear radiating member is adhered to the package base at low temperature there is caused a possibility that detachment or falling off of the heat radiating may be caused by heating at a later process. On the other hand, in order to prevent such falling off, it is necessitated to limit the temperature of heating at the later process to a lower range, thus causing a large influence to the freedom of the later process and the heat-resisting property of the product.

As will be understood from the result of sample calculation, it has heretofore-been believed that it is more difficult to adhere a heat radiating member made of copper to a ceramic substrate as the heat radiating member becomes larger.

However, when the heat radiating member made of copper or copper alloy is made thinner, the heat radiating member can be deformed more easily by the resulting thermal stresses, thus making it possible to absorb the thermal stresses and make them smaller.

That is, in the case where the heat radiating member is thick, the thermal stresses generated therein becomes larger as the thickness of the heat radiating member increases, and furthermore the heat radiating member can deform a quite little due to its thickness. Accordingly, most of the thermal stresses generated in the heat radiating member remains therein as residual stresses. Accordingly, in the case where the residual stresses exceed the rupture strength (tensile strength), the ceramic substrate is broken and a crack or cracks are caused therein. Further, even in the case where the residual stresses do not exceed the rupture strength, a durability test such as thermal shock test or repeated actual use may cause a crack or cracks in the ceramic substrate, thus lowering the reliability and durability.

However, when the heat radiating member is thin, the thermal stresses generated in the ceramic substrate becomes smaller as the thickness of the heat radiating member becomes smaller and further more the heat radiating member can be deformed more easily, so the thin heat radiating member is caused to deform largely by the thermal stresses and thereby release part of the thermal stresses from the ceramic substrate such that the residual stresses become relatively smaller. Accordingly, even in the case where the length of adherence of the heat radiating member is large, there is caused such a case where the residual stresses are smaller than the rupture strength. In such a case, a crack or cracks are not caused in the ceramic substrate, and in the case where the residual stresses are sufficiently smaller than the rupture strength the package base can attain a sufficient durability against thermal shock and repeated use.

(Sample Calculation 1-2)

In order to confirm this, calculation similar to that described above is made with respect to the cases where it is assured that in the package base shown in FIG. 1 the thickness t of the heat radiating member is 1 mm and 0.5 mm, and the result is shown in the graph of FIG. 4. In the meantime, for reference, the result of calculation in the case where t=2 mm is also shown.

From the graph of FIG. 4, it is seen that in the case where the thickness t of the heat radiating member is 1 mm the maximum residual stress at any size D of the adhering portion of the heat radiating member 45 is smaller than the rupture strength of alumina, i.e., 20~30 kgf/mm$^2$.

Accordingly, it is considered that in the case of adherence of such a heat radiating member 45 the possibility that a crack or cracks are caused at least at the point of time of adhering and successive cooling is sufficiently reduced.

Further, it will be seen that in the case where t=0.5 mm the maximum residual stress at any size D of the adhering portion of the heat radiating member 45 is smaller than 10 kgf/mm$^2$.

Accordingly, in this case, it is supposed that the package base have a sufficient strength with respect to the rupture strength so a better yield than that in the case where t=1 mm is obtained and the durability is improved.

By this calculation, it is proved that it is effective and useful to use a thin copper plate as a heat radiating member.

In the meantime, the heat radiating member made of copper or copper alloy have the following characteristics.

The thermal conductivity of pure copper (oxygen-free copper) $\lambda$ is about 390 W/m k and is 1.9 times larger than that of Cu-W since the thermal conductivity of Cu-W is about 210 W/m K.

When the heat radiating from the IC chip is transferred so one of the side surfaces of the heat radiating member made of copper, the heat can be transferred to the other of the side surfaces of the heat radiating member whilst being transferred rapidly in an area extending in the direction parallel to the side surfaces of the heat radiating member, i.e., toward the periphery of the beat radiating member, so that the heat can be distributed to a larger area. Accordingly, the heat radiating member can transmit heat to the open air or to the heat radiating fin efficiently. It is considered that such a heat transfer area extending in the direction parallel to the side surfaces of the heat radiating member is proportional to the thermal conductivity and also to the thickness of the heat radiating member.

Accordingly, in order to attain nearly the same heat transfer area as the heat radiating member made of Cu-W, the thickness of the heat radiating member which is made of copper having a high thermal conductivity can be smaller.

That is, in order to attain nearly the same heat radiating property as the heat radiating member made of Cu-W, the heat radiating member made of copper can be smaller in thickness, and by making the thickness smaller the thermal stresses caused at the joint between the ceramic substrate and the heat radiating member can be reduced by the deformation of the heat radiating member for thereby reducing the residual stresses in the ceramic substrate and preventing breakage of the same.

This invention is thus effective for solving the above noted problems inherent in the prior art device.

Accordingly, it is an object of the present invention to provide a novel and improved ceramic IC package base which is provided with a heat radiating member which is easy in design but has an excellent heat radiating property, a high reliability and an excellent durability.

DETAILED DESCRIPTION OF THE PREFERRED EMBODIMENTS

First Embodiment

Figure 1:
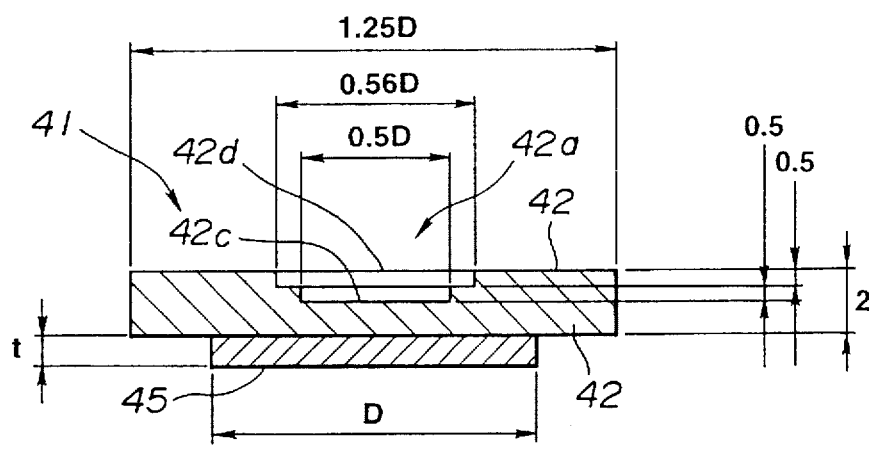
FIG. 1 is a sectional view of a package base used for sample calculation 1.
Figure 2:
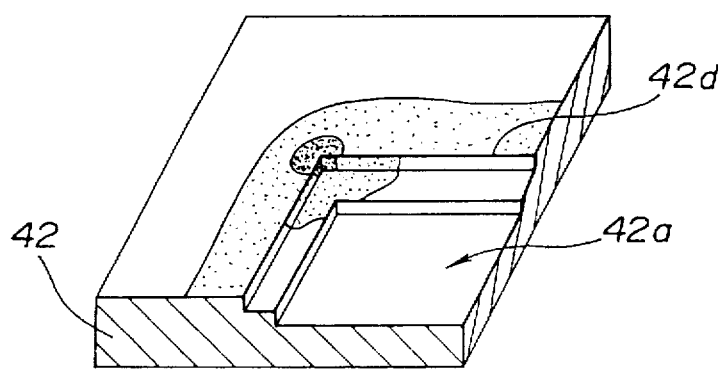
FIG. 2 is a perspective view of an ¼ section of the package base of FIG. 1 for illustration of the distribution of residual stresses caused therein.
Figure 3:
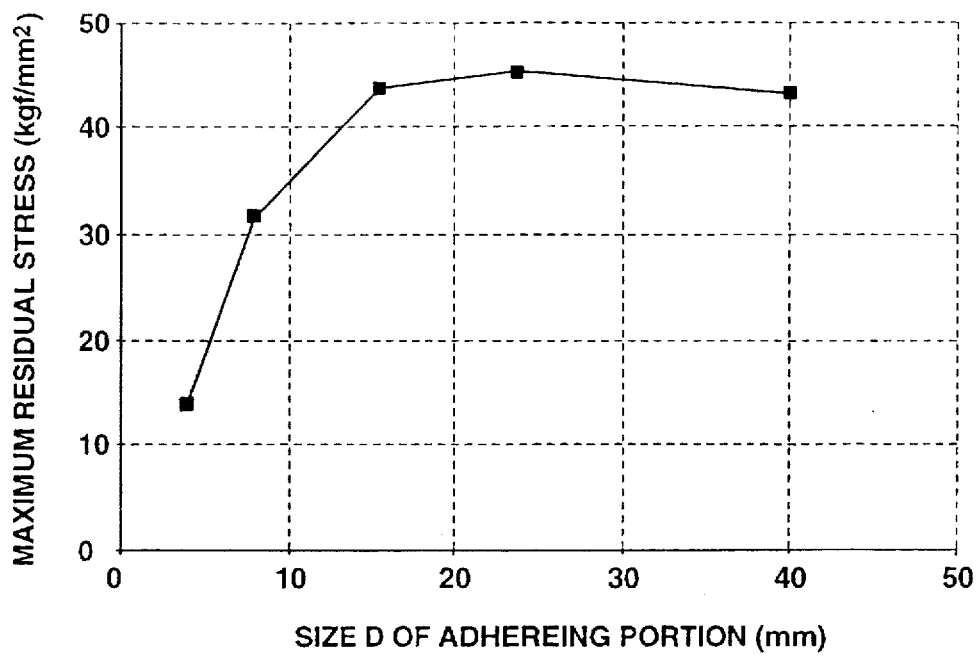
FIG. 3 is a graph of a relation between size D of adhering portion and maximum residual stress in the package base of FIG. 1 when it is assumed that the thickness t of the heat radiating member is 2 mm (i.e., t=2 mm)
Figure 4:
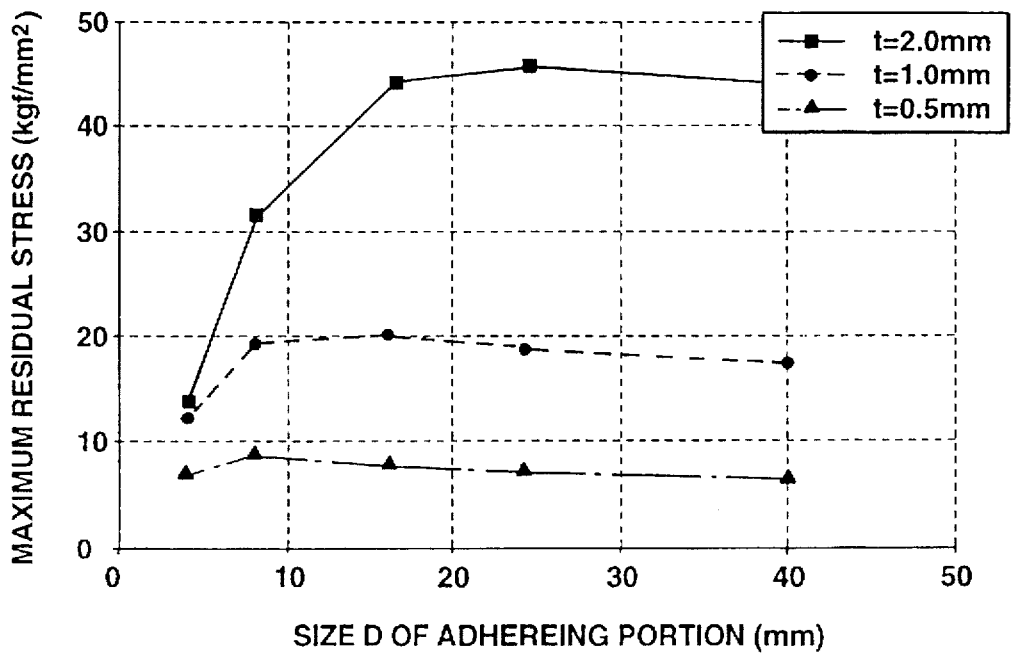
FIG. 4 is a graph of a relation between size D of adhering portion and maximum residual stress in the package base of FIG. 1 when it is assumed that thickness t of the heat radiating member is 0.5 mm, 1 mm and 2 mm.
Figure 5A:
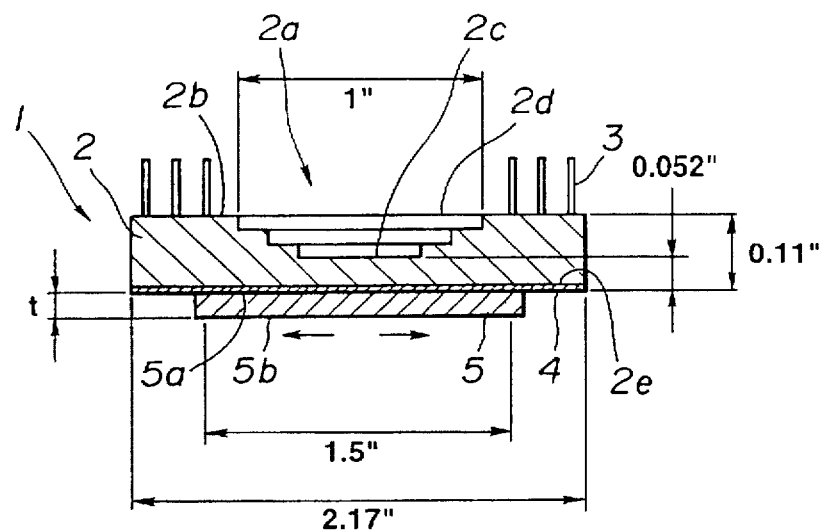
FIG. 5A is a sectional view of a package base having a heat spreader according a first embodiment.

Referring first to FIG. 5A, a PGA (Pin Grid Array) type ceramic package base according to an embodiment of the present invention will be described. With respect to the package base which is generally indicated by 1 in FIG. 5A, a thermal shock test for inspecting the reliability and durability and measure of a thermal resistance for inspecting the heat radiating property were made.

The package base 1 includes a ceramic substrate 2 which is formed from a ceramic material containing 92% alumina. The ceramic substrate 2 has a square shape when observed in a plan view. The ceramic substrate 2 is 50 mm×50 mm (2.17"×2.17") in outside dimension, and the outer peripheral portion 2b is 2.79 mm (0.11") thick. The ceramic substrate 2 has at the central portion thereof a recess 2a. The recess 2a has an opening end portion 2d which is 24.5 mm×24.5 mm (1"×1") in size. Each of the side surfaces of the recess 2a is formed into a stepped shape. The bottom of the recess 2a serves as an IC chip attaching portion (die-attach portion.) 2c of the size of 19.0 mm×19.0 mm (0.75"×0.75"). The thickness d of the ceramic forming the bottom portion is 1.32 mm (0.052"). A number of terminals (pins) made of kovar for connection to the outside are provided in such a manner as to project from the upper surface of the outer peripheral portion 2b.

On the other hand, one main surface of the ceramic substrate 2, i.e., a rear surface 2e of the IC chip attaching portion 2c provided to the ceramic substrate 2, is provided at the entire surface thereof with a metallized layer 4 composed of a tungsten metallized layer section and a Ni plating section.

A heat spreader type heat radiating member 5 made of oxygen-free copper is adhered by a silver brazing metal (not shown) to the metallized layer 4. The heat spreader 5 is 38.1 mm×38.1 mm (1.5"×1.5") in outside dimension (the size of the adhering portion), and the thickness t thereof ranges from 0.5 mm (0.02"=20 MIL) to 2.5 mm (100 MIL). The metallized layer 4 is plated with Ni and Au for protection from oxidation.

The heat generated by an IC chip (not shown) is transferred through the IC chip attaching portion 2c to an adhering surface 5a of the heat spreader 5. From the adhering surface 5a, the heat is transferred toward a radiating surface 5b and in a direction transveral to the thickness direction of the heat spreader 5 (i.e., in the directions indicated by the arrows in FIG. 5) by the effect of a high heat conductivity. From the radiating surface 5b, the heat is transferred to the open air and thus radiated.

(Evaluation of Durability)

Package bases having heat spreaders 5 of various thicknesses t were prepared. The package bases were examined upon whether a crack or cracks were caused or not with visual inspection and by fluorescent crack inspection (ZYGRO check), in the order as shown in the low chart of FIG. 6, after brazing, after heating on the supposition of die attachment and hermetic sealing, after a liquid phase thermal shock test (T/S), and after a gas phase thermal shock test (T/C), respectively.

TABLE 1

| HEAT SPREDER (HEAT RADIATING MEMBER) THICKNESS 1 (mm/MIL) | AFTER BRAZ- ING (A/B*) | T/S AFTER 100 CYCLES (A/B*) | T/C AFTER 300 CYCLES (A/B*) | T/C AFTER 1000 CYCLES (A/B*) |
|---|---|---|---|---|
| 0.5(20) | 0/10 | 0/10 | 0/10 | 0/10 |
| 1.0(40) | 0/10 | 0/10 | 7/10 | 10/10 |
| 1.6(60) | 0/10 | 10/10 | | |
| 2.0(80) | 10/10 | | | |
| 2.5(100) | 10/10 | | | |

*A/B REPRESENTS NUMBER OF DEFECTIVE (S)/TOTAL NUMBER OF SAMPLES.

In the meantime, the heating on the supposition of die attachment was made at the temperature of 450° C. for three minutes, and the heating on the supposition of the hermetic sealing was made at the temperature of 300° C. for five minutes. Each heating was made for once. Thereafter, a liquid phase thermal shock test (T/S, MIL-STD-883, Method 1011, Cond.C) and a gas phase thermal shock test (T/C, MIL-STD-883, Method 1010, Cond.C) were made at the temperature ranging from −65° C. to +150° C., and 100 cycles of T/S and 1000 cycles of T/C were made, respectively.

The result is shown in Table 1.

(Sample Calculation 2)

With respect to the package base according to the first embodiment, the thickness t of the heat spreader was varied by FEM (Finite Element Method) similarly to the above described sample calculation 1, and the maximum residual stress was calculated.

Figure 7:
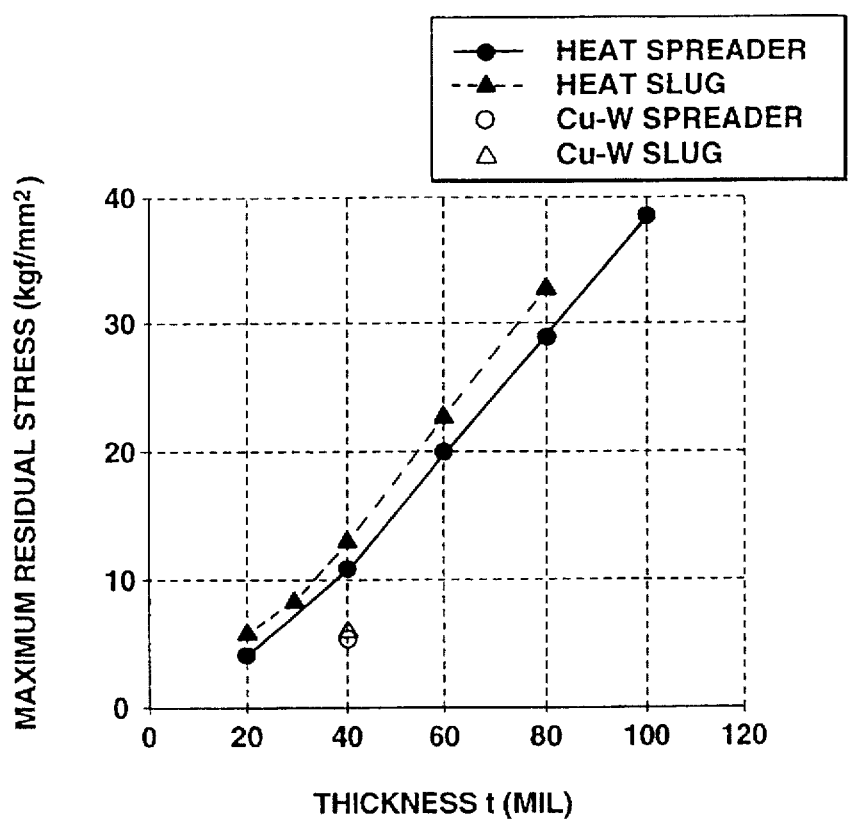
FIG. 7 is a graph of a relation between thickness of heat radiating member and resulting maximum residual stress, which is the result of sample calculation 2 made with respect to the package bases shown in FIGS. 5A and 5B.

The result is shown in the graph of FIG. 7.

Figure 5B:
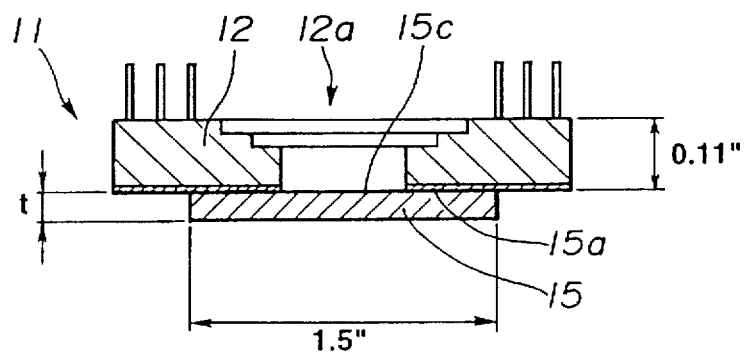
FIG. 5B is a sectional view of a package base having a heat slug, which is used for sample calculation 3.

In the graph of FIG. 7, there is also shown the result of calculation which was made with respect to a package base 11 shown in FIG. 5B, i.e., a so-called heat slug type package base which does not have, though of the same dimensions as that shown in FIG. 5A, an IC chip attaching portion in the form of a recess, but a hole 12a penetrating through the ceramic substrate 12, i.e., a through hole 12a with stepped side surfaces and adapted to make part of an adhering surface 15a of a heat radiating member 15 serve as an IC chip attaching portion 15c.

For reference, the result of the cases where a heat spreader and a heat slug which are 40 MIL thick and made of Cu-W is also shown.

From the result of Table 1, it is seen that in the cases where the spreader 5 was 80 MIL thick and 100 MIL thick cracks were caused at the time of brazing. It is considered that this is because at the time of cooling after brazing a residual stress exceeding the rapture strength (tensile strength) of the alumina ceramic had already been caused to break the ceramic substrate 2.

On the other hand, by the graph of FIG. 7, the maximum residual stress in the case where the thickness of the heat spreader 5 is 80 MIL or more is calculated at about 25 kgf/mm² or more and is therefore equal to or larger than the above described tensile strength of alumina, i.e., 20–30 kgf/mm². Accordingly, in this range, it is predicted that the ceramic substrate is broken at the time of brazing, and this prediction coincides with the result of Table 1 quite well.

Then, in Table 1, in the case where the thickness of the heat spreader 5 is within the range from 40 to 60 MIL, there was not caused any problem just after brazing but after the thermal shock test (T/S or T/C) cracks were caused. This indicates that since the residual stress is not so large as to exceed the tensile strength there is not caused any breakage at the time of brazing but breakage of the ceramic substrate 2 is caused when subjected to thermal shock (thermal stress) repeatedly by the thermal shock test (T/S or TC).

On the other hand, by the graph of FIG. 7, in the case where the thickness of the heat spreader 5 is within the range from 40–60 MIL, the maximum residual stress is calculated at 10–20 kgf/mm². By the stress of this magnitude breakage of the ceramic substrate never occurs at the time of brazing. However, it is predicted that by repeated application of thermal stress in addition to the residual stress the ceramic substrate is broken. That is, in this case, this prediction coincides with the result of Table 1 quite well.

Further, it will be seen from Table 1 that in the case where the thickness of the heat spreader 5 is 20 MIL there is not caused any crack after 1000 cycles of the gas phase thermal shock test (T/C) and thus the heat spreader has a good reliability. It is considered that this is because the residual stress of the heat spreader 5 was sufficiently small so that the ceramic substrate 2 was not broken even at the time of brazing and even at the time of being applied with thermal stresses repeatedly.

Similarly, it will be seen from the graph of FIG. 7 that in the case where the heat spreader 5 was 20 MIL thick, the residual stress is sufficiently small, i.e., about 5 kgf/mm², so the residual stress is within the range for allowing the ceramic substrate to be able to withstand the brazing and the repeated application of thermal stresses and this also coincides with the result of Table 1.

In this connection, in the case where a heat spreader or a heat slug made of Cu-W is used, the residual stress is calculated at a small value, i.e., about 5 kgf/mm². This coincides with the fact that a heat radiating member made of Cu-W actually has a sufficient durability.

From the comparison between Table 1 and the graph of FIG. 7, it is seen that the result of actual test and the result of maximum residual stress calculation coincides with each other quite well, so that the result of residual stress calculation by FEM can be considered as representing quite well how the actual residual stresses in the ceramic substrate are.

Further, the graph of FIG. 7 indicates that the residual stress varies depending upon a variation of the thickness of the heat spreader 5, and that the thinner the heat spreader the smaller the residual stress, i.e., the residual stress is nearly proportional to the thickness of the heat spreader 5.

From the fact that in the case where the heat spreader 5 is used the result of calculation coincides with the actual measurement quite well, it is considered that in the case where the heat slug type heat radiating member 15 is used the dotted line in FIG. 7 represents a nearly correct result, and it is predicted that if an actual measurement is carried out with respect to this type of heat radiating member 15 a result similar to Table 1 will be obtained.

(Sample Calculation 3)

With respect to the heat spreader type heat radiating member 5 for the package base 1 of the first embodiment shown in FIG. 5A, the thickness t is set to be of constant values as shown in FIG. 5A, i.e., 0.5 mm (20 MIL) and 1 mm (40 MIL). It is assumed that the thickness (total thickness) of the peripheral portion of the ceramic substrate 2 is T, the depth of each of stepped portions 2f (i.e., the difference in level between adjacent steps) is constant and is s, and the thickness of the IC chip attaching portion 2c is d. By varying T and d, the maximum residual stress is calculated by FEM.

Figure 8A:
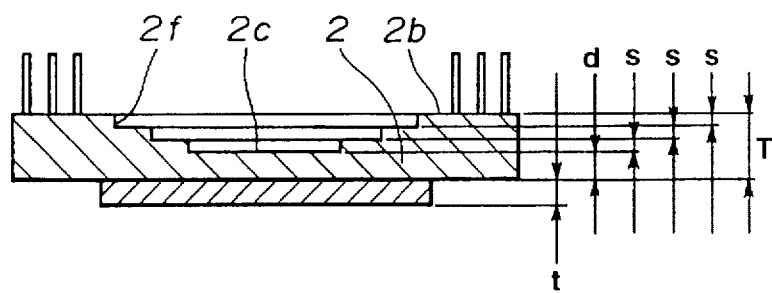
FIGS. 8A and 8B are sectional views of package bases used for sample calculation 3.
Figure 8B:
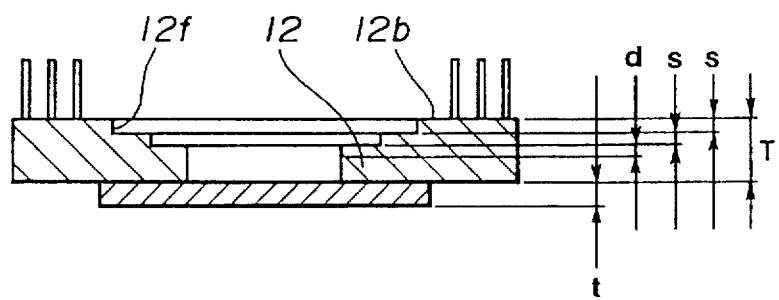

Similarly, with respect to the heat slug type heat radiating member 15 for the package base 11 shown in FIG. 5B, the heat radiating member 15 and the ceramic substrate 12 are formed as shown in FIG. 8B, i.e., similarly to those shown in FIG. 8A except that the ceramic substrate 12 is not provided with an IC attaching portion. In the manner similar to that in the package base shown in FIG. 8A, T and s are set and the thickness d of an imaginary IC attaching portion is calculated. Thereafter, the maximum residual stress is calculated by FEM by varying T and d.

The result is shown in FIGS. 9A, 9B, 10A and 10B.

Figure 9A:
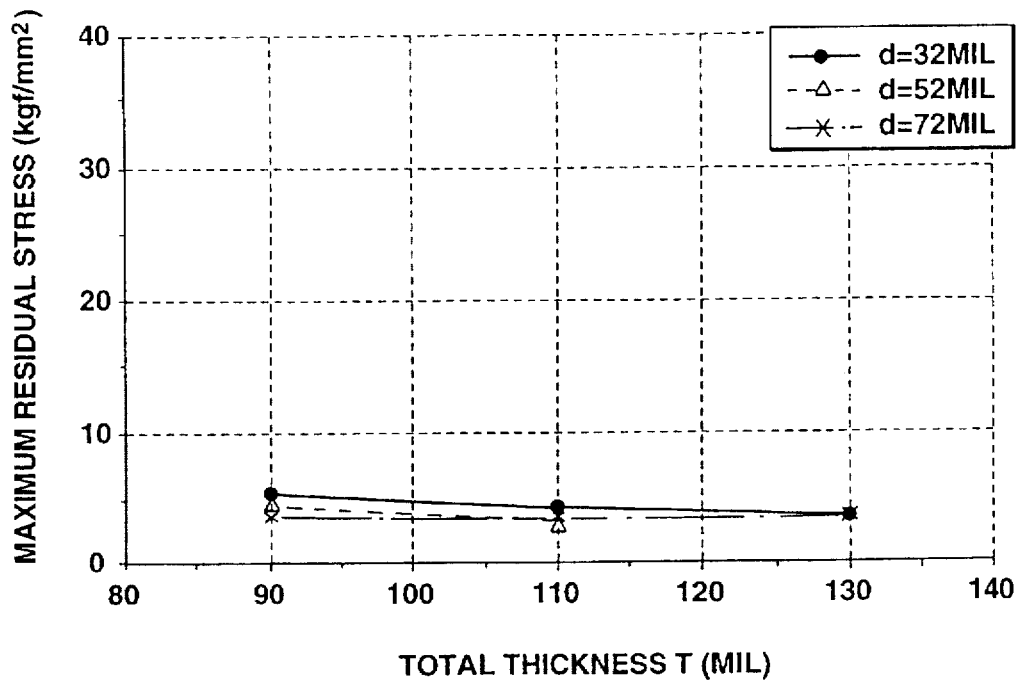
FIG. 9A is a graph of a relation of total thickness T and thickness d with respect to maximum residual stress in the package base of FIG. 8A when t=0.5 mm (20 MIL)
Figure 9B:
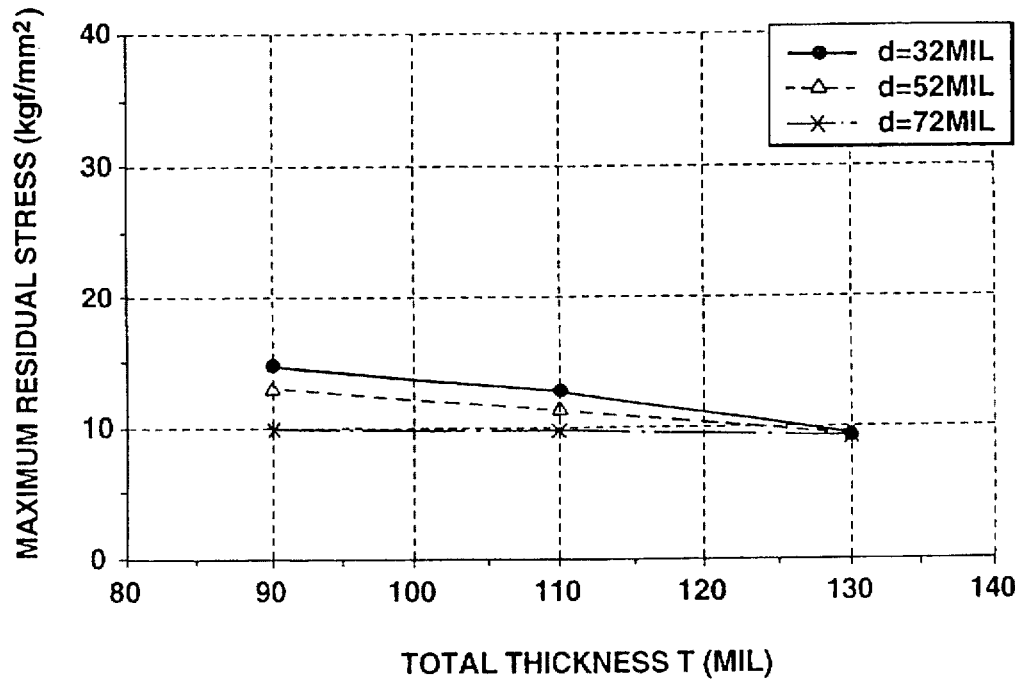
FIG. 9B is a graph of a relation of total thickness T and thickness d with respect to maximum residual stress in the package base of FIG. 8A when t=1.0 mm (40 MIL)

FIGS. 9A and 9B are concerned with the case where a heat spreader is used. FIG. 9A represents the result obtained when t=0.5 mm, (20 MIL), and FIG. 9B represents the result obtained when t=1.0 mm (40 MIL). From these results, it will be understood that although the total thickness T and the thickness d are varied the residual stress is now varied so much. It is predicted that this is due to the fact that since the heat radiating member is constant in size (thickness) the thermal stress resulting between the heat radiating member and the ceramic substrate is not varied so much, and the fact that the ceramic is hard (i.e., modulus of longitudinal elasticity is high) so that even if T and d are varied the ceramic substrate is not deformed so much and therefore release of the thermal stress by deformation does not occur, whereby to allow residual stresses to become nearly the same.

Figure 10A:
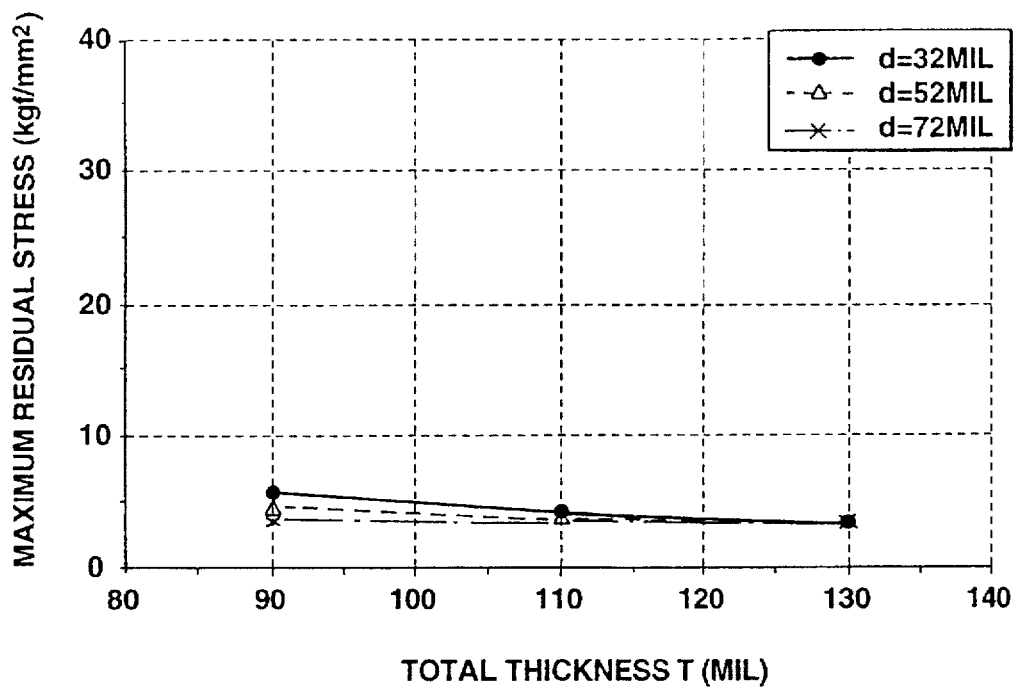
FIG. 10A is a graph of a relation of total thickness T and thickness d with respect to maximum residual stress in the package base of FIG. 8B when t=0.5 mm (20 MIL)
Figure 10B:
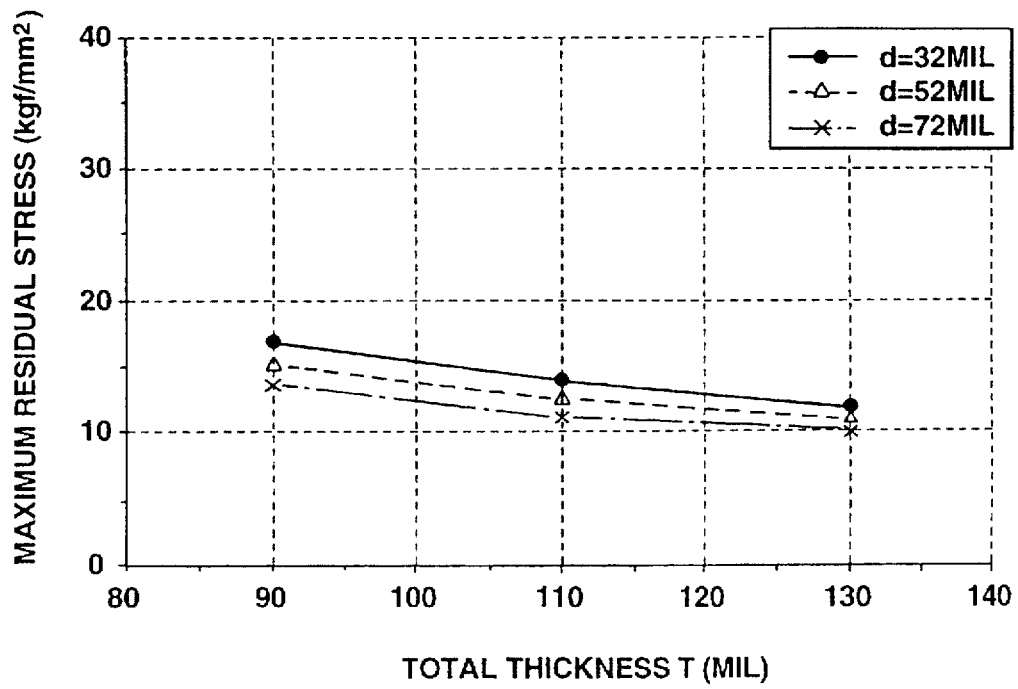
FIG. 10B is a graph of a relation of total thickness T and thickness d with respect to maximum residual stress in the package base of FIG. 8B when t=1.0 mm (40 MIL)

Similarly, also in the case where a heat slug is used, it is seen from the result shown in FIG. 10A where t=0.5 mm (20 MIL) and from, the result shown in FIG. 10B where t=1.0 mm that the maximum residual stress does not vary so much even when the total thickness T and the thickness t are varied.

Accordingly, it will be understood that in order to attain a heat radiating member of a high reliability through reduction of maximum residual stress it is important to make thinner the thickness t of the heat radiating member than to vary the thickness T and the thickness d and therefore the difference s in level between adjacent steps of the ceramic substrate. That is, it will be seen that in order to improve the reliability of the package base it will do to examine, in designing the package base, only the thickness t of the heat radiating member.

(Evaluation of Heat Radiating Property)

With respect to the package base produced according to the embodiment of FIG. 5A, the thermal resistance $\theta_{ja}$ was measured as representing the heat radiating property. In this connection, the thermal resistance $\theta_{ja}$ is the result obtained by dividing the difference between the temperature of a PN junction disposed on a heater (not shown) which is 15.2 mm (0.6") square, installed on the IC chip attaching portion 2c in place of an IC chip and energized to generate heat (i.e., the temperature of the PN junction corresponds to the temperature of the IC chip) and the atmospheric temperature by the input heat power (input electric power) of the heater, and indicates how many degrees the temperature of the IC chip rises for a given input power of 1 W, i.e., the thermal resistance $\theta_{ja}$ is a parameter representative of the easiness or efficiency with which the package base can radiate heat.

TABLE 2

| EXIS-TENCE OF FIN | HEAT SPREADER | | THREMAL RESISTANCE θ ja (°C./W) AIR FLOW VELOCITY | |
|---|---|---|---|---|
| | MATERIAL | THICKNESS (MIL) | 0 m/s | 2 m/s |
| NO | Cu (OFHC) | 12 | 11.8 | 5.5 |
| | | 20 | 11.6 | 5.4 |
| | | 30 | 11.5 | 5.3 |
| | | 40 | 11.6 | 5.2 |
| | Cu-W | 40 | 11.7 | 5.3 |
| | NOT PROVIDED | — | 14.6 | 8.4 |
| YES | Cu (OFHC) | 12 | 7.5 | 3.2 |
| | | 20 | 7.6 | 3.3 |
| | | 30 | 7.6 | 3.1 |
| | | 40 | 7.4 | 3.3 |
| | Cu-W | 40 | 7.5 | 3.2 |
| | NOT PROVIDED | — | 8.1 | 3.7 |

Measurement of the thermal resistance $\theta_{ja}$ was made with respect to two cases, i.e., the case where nothing is attached to the heat radiating surface 5b of the heat spreader 5 and the case where an aluminum heat radiating fin is adhered to the heat radiating surface 5b by a thermally conductive epoxy adhesive. For the purpose of comparison, measurement of the thermal resistance $\theta_{ja}$ was further made with respect to the case where a heat spreader made of Cu-W and of the thickness of 40 MIL was used, the case where no heat spreader was used, and the case where a heat spreader and a fin attached thereto were used.

Figure 11:
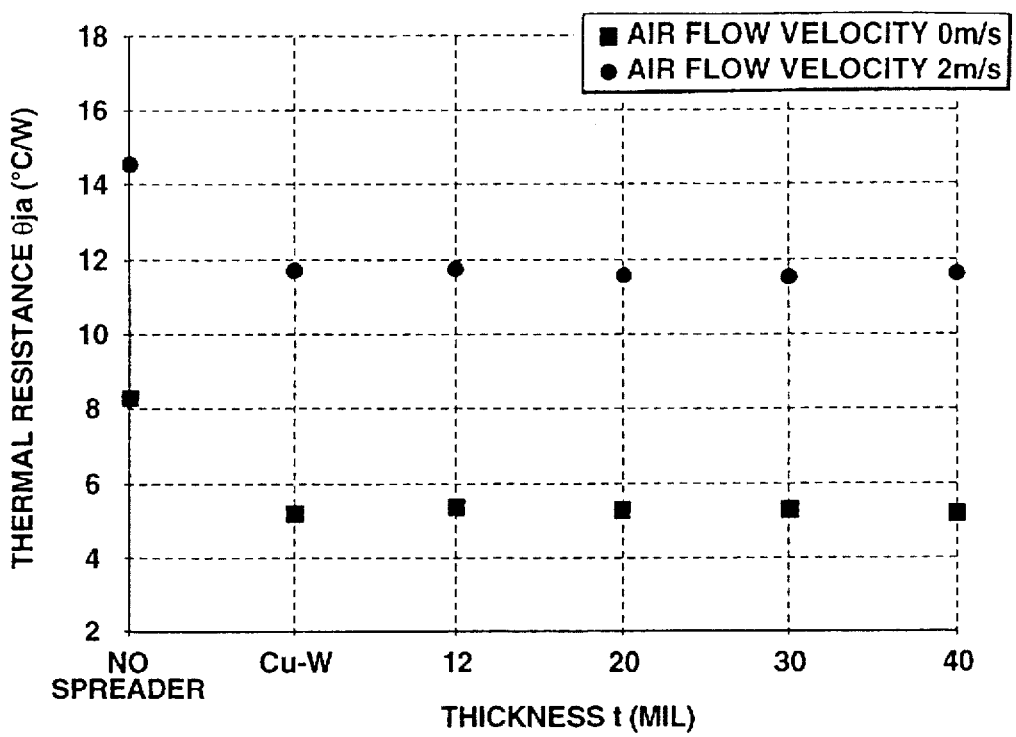
FIG. 11 is a graph of a relation between thickness t of heat radiating member and thermal resistance $\theta_{ja}$ in the case where a package substrate is not provided with any heat radiating fin.
Figure 12:
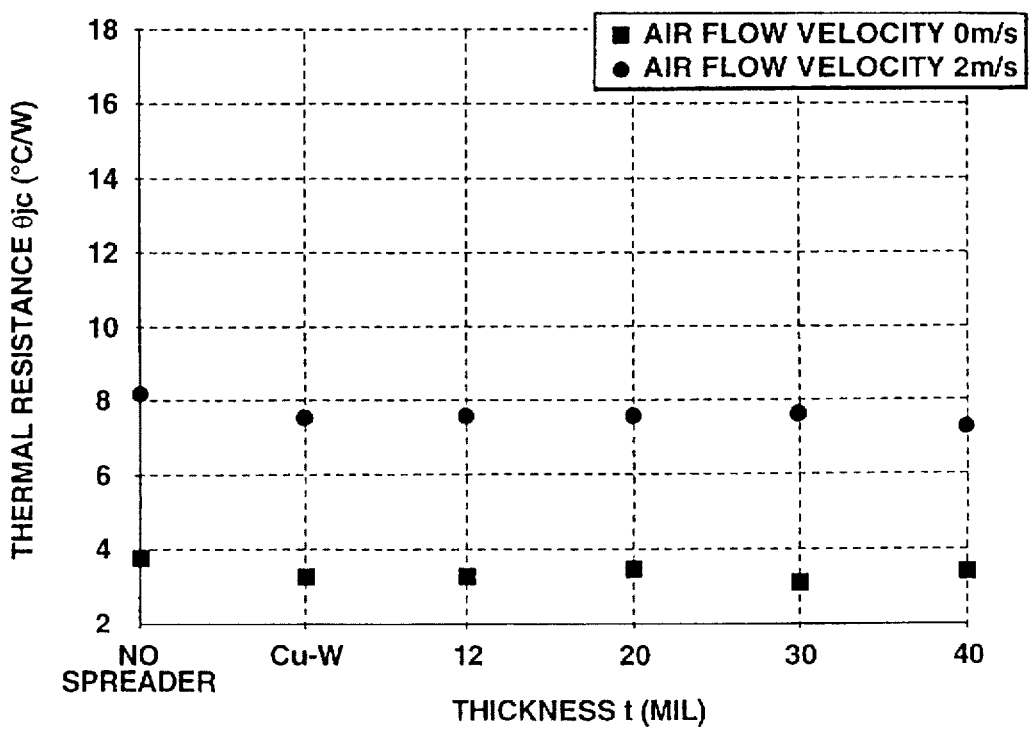
FIG. 12 is a graph of a relation between thickness t of heat radiating member and thermal resistance $\theta_{ja}$ in the case where a package substrate is provided with a heat radiating fin.

The result of measurement with respect to the thermal resistance $\theta_{ja}$ (°C./W) in the case where the input electric power was 4 W is shown in Table 2 and FIGS. 11 and 12.

From the result of Table 2 and FIGS. 11 and 12, it is seen that the heat spreaders made of copper and of the thicknesses of 12, 20, 30 and 40 MIL exhibited nearly the same thermal resistance as the heat spreader made of Cu-W and of the thickness of 40 MIL. Accordingly, it will be seen that the heat radiating member made of copper and of about ⅓ of the thickness of that made of Cu-W can attain nearly the same heat radiating property as that made of Cu-W.

Furthermore, as having confirmed by the above described thermal shock test (Table 1), a high reliability was attained when the thickness was small (i.e., 20 MIL in this example), so it will be understood that copper is useful or effective for a heat radiating member (heat spreader).

In this instance, by the heat spreaders 5 made of copper and of the thicknesses of 12, 20, 30 and 40 MIL, nearly the same heat radiating property was attained. This indicates that when in the package base according to the embodiment 1 the thickness of the heat spreader 5 made of copper is 12 MIL, heat can be transferred to a radially expanded sufficiently large area of the heat spreader (i.e., an area extending in the direction transversal to the thickness direction), i.e., the surface temperature of the heat spreader can be made uniform, and after that the heat can transferred from the heat spreader to the atmosphere or the fin, so even if the thickness is increased further it is impossible to expect much improvement of the heat radiating property.

In the meantime, also in the heat slug type, it will be easily supposed that nearly the same heat radiating property as the conventional heat slug made of Cu-W can be attained through similar reduction of the thickness of the heat slug made of copper.

However, the coefficient of thermal expansion of the IC element to be installed on the heat slug is, in the case of a Si chip, about $4.8\times10^{-6}$/K and therefore largely differs from that of copper, so when attachment (adherence) of the IC element is made directly by a Au-Si brazing metal, it is considered that thermal stresses due to the difference in thermal expansion are applied to the IC chip to cause cracks or flaking of the IC chip for thereby deteriorating the durability or to cause piezoresistance effect.

For the adherence of the IC chip, it is thus desirable to employ soldering at low temperature or bonding by means of an adhesive of a resinous material such as epoxy or ester or interpose between the IC chip and the heat slug a member of ceramic or metal such as AlN, BeO and Mo which is high in thermal conductivity and approximates to the coefficient of thermal expansion of the IC chip, with a view to mitigating the difference in thermal expansion between them.

Second Embodiment

With respect to the package base having a little different size and the case where the thickness t is equal to or smaller than 40 MIL, investigations on the reliability (durability) were made by varying the thickness t.

Figure 13A:
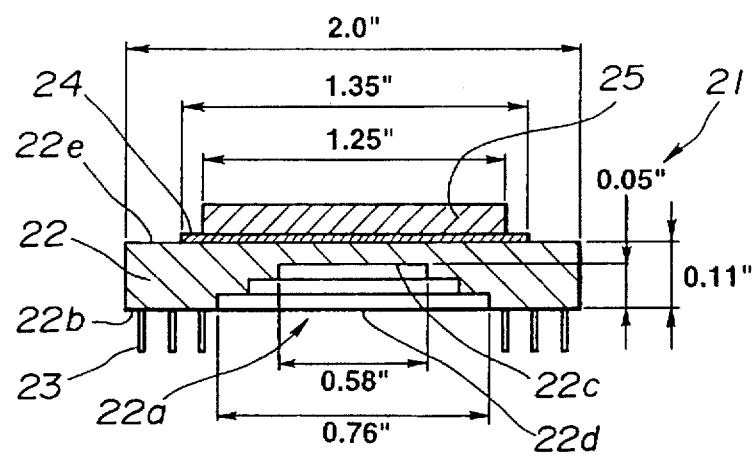
FIG. 13A is a sectional view of a package base according to a second embodiment of the present invention, which is not provided with a heat radiating fin.

In FIG. 13A, the shape and the size of a PGA (Pin Grid Array) type package 21 used for the above investigations are shown.

The ceramic substrate 22 used in the package base 21 of this embodiment, similarly to the package base 1 of the first embodiment of FIG. 5A, is formed from a ceramic material containing 92% alumina, square in shape when observed in plan view and has the outside dimension of 50 mm×50 mm (2.0"×2.0"). At the center of the ceramic substrate 22, there is formed a recess 22a having side surfaces each formed into a stepped shape. The opening end portion 22d of the recess 22a is of the size of 19.3 mm×19.3 mm (0.76"×0.76"). The IC chip attaching portion (die-attach portion) 22c at the bottom of the ceramic substrate 22a is of the size of 14.7 mm×14.7 mm (0.58"×0.58"), and the thickness of this substrate portion (i.e., the depth of the recess 22a) is 1.32 mm (0.05"). The thickness (total thickness) of the outer peripheral portion 22b is 2.79 mm (0.11"). A number of terminals (pins) 23 made of 42 alloy for connection to the outside are adhered to the upper surface of the outer peripheral portion 22b to protrude therefrom.

On the other hand, one main surface of the ceramic substrate 22, i.e., the rear surface 22e of the IC chip attaching portion 22c of the ceramic substrate 22 is provided with, at the central portion thereof, a square metallized layer 24 one side of which is 34.3 mm (1.35") and comprised of a tungsten metallized layer section and a Ni-plating section.

Adhered by a silver brazing metal (not shown) to the metallized layer 24 is one of eight kinds of heat spreaders 25 which are made of oxygen-free copper (OFHC, JISC1020), each have the outside dimension (the size of the adhering portion) of 31.8 mm (1.25") and have the thicknesses t of 0.2 mm (8 MIL), 0.25 mm (10 MIL), 0.3 mm (12 MIL), 0.38 mm (15 MIL), 0.5 mm (20 MIL), 0.64 mm (25 MIL), 0.76 mm (30 MIL) and 1.02 mm (40 MIL), respectively. The heat spreaders 25 are plated with Ni and Au and thereby protected from oxidation.

Figure 6:
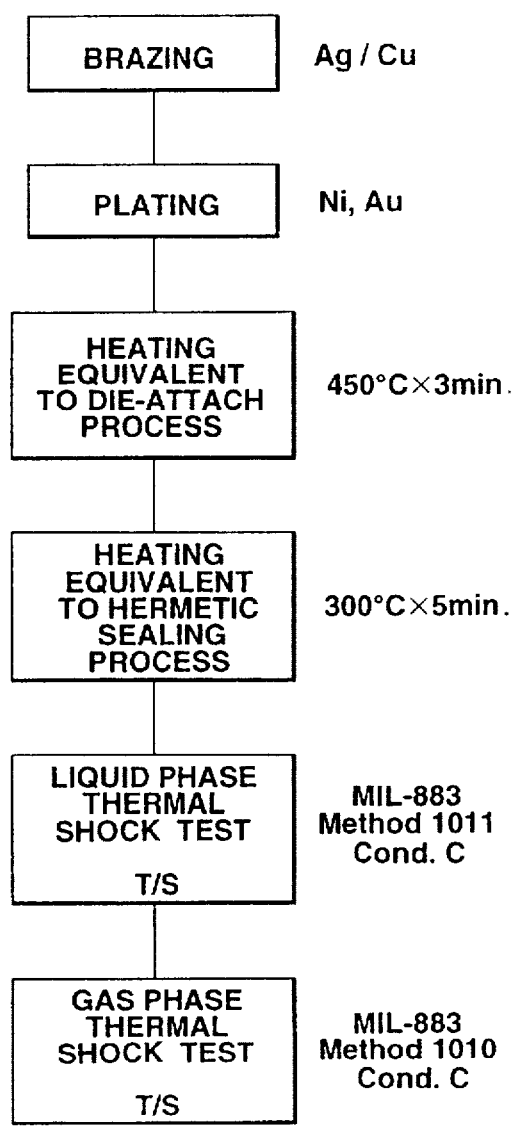
FIG. 6 is a flow chart of steps of a test for the reliability of a package base.

Then, the package bases were examined upon whether a crack or cracks were caused or not, in the order as shown in the flow chart of FIG. 6, after brazing, after heating on the supposition of die attachment and hermetic sealing, after a liquid phase thermal shock test (T/S), and after a gas phase thermal shock test (T/C), respectively.

The result of the examination is shown in Table 3. In the meantime, a heat spreader of the thickness of 40 MIL and made of Cu-W was prepared as a comparative example and examination thereof was also made.

From the above result, it will be seen that in the case where the thickness t is equal to or smaller than 0.76 mm (30 MIL) a quite high reliability is attained similarly to the case where a heat spreader of the thickness of 40 MIL and made of Cu-W is used.

TABLE 3

| HEAT SPREADER (HEAT RADIATING MEMBER) | | THERMAL SHOCK TEST | | | | | |
|---|---|---|---|---|---|---|---|
| | | T/S | T/C | | | | |
| | THICK- | (CYCLES) | (CYCLES) | | | | |
| MATE- RIAL | NESS (MIL) | 15 (A/B*) | 100 | 100 | 300 | 500 | 1000 | 2000 |
| Cu (OFHC) | 8 | 0/20 | ← | ← | ← | ← | ← | ← |
| | 10 | 0/20 | ← | ← | ← | ← | ← | ← |
| | 12 | 0/20 | ← | ← | ← | ← | ← | ← |
| | 15 | 0/20 | ← | ← | ← | ← | ← | ← |
| | 20 | 0/20 | ← | ← | ← | ← | ← | ← |
| | 25 | 0/20 | ← | ← | ← | ← | ← | ← |
| | 30 | 0/20 | ← | ← | ← | ← | ← | ← |
| | 40 | 0/20 | ← | ← | 12/20 | 15/20 | 20/20 | |
| Cu-W | 40 | 0/20 | ← | ← | ← | ← | ← | ← |

*A/B REPRESENTS NUMBER OF DEFECTIVE(S)/TOTALNUMBER OF SAMPLES.

However, in the case where the thickness t is smaller than 0.25 mm (10 MIL), there may possibly occur such a case in which the thickness is so small that plastic deformation is caused at the tire of brazing and undulations are formed in the surface of the heat spreader after brazing. Such undulations make it impossible to attach a fin to the heat spreader uniformly and furthermore undesirable from the appearance point of view. Furthermore, in the case where the thickness t is smaller than 0.3 mm (12 MIL), the heat spreader can be bent easily during the process of brazing or the like difficulty in handling is caused so it is desirable to make the thickness t a little larger.

Figure 13B:
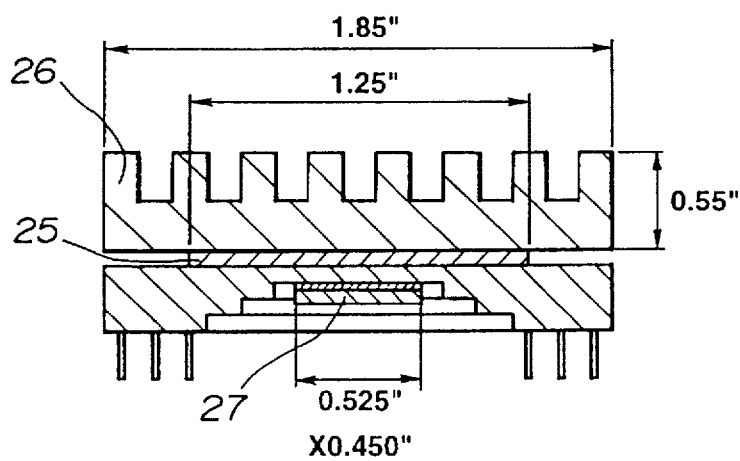
FIG. 13B is a sectional view of a package base according to a second embodiment of the present invention, which is provided with a heat radiating fin.

Then, in the above described embodiment 2, there were prepared package bases 21 of the thicknesses t of 15 MIL, 20 MIL, 25 MIL and 30 MIL, respectively, each of which had a heat spreader 25 to which, as shown in FIG. 13B, a heat radiating fin made of aluminum and having a square shape of the size of 47 mm×47 mm (1.85"×1.85") and the thickness of 14 mm (0.55") was adhered by means of thermally conductive epoxy (not shown). Then, a heater 27 of the size of 13.3 mm (0.525")×11.4 mm (0.45") equated to an IC chip was soldered by a Au-Sn soldering metal to each of the package bases, and measurement of the thermal resistance ($\theta_{ja}$, $\theta_{jc}$) was made.

In this connection, the thermal resistance $\theta_{ja}$ is the parameter of the same kind as in the case of the above described first embodiment. On the other hand, the thermal resistance $\theta_{jc}$ is a parameter which is representative of how many degrees the temperature of the IC chip relative to the temperature of the heat radiating fin rises for a given electrical input of 1 watt, which is known through measurement of the temperature of a PN junction (corresponding to the temperature of the IC chip) under the condition where the heater 27 is made to generate heat and through Measurement of the surface temperature of the heat radiating fin 26.

Measurements were made under the conditions of the air flow velocity being 0 m/s, 0.5 m/s and 1 m/s, respectively, and the input electrical power was set to 8.5 watts.

In the meantime, for comparison, measurement was made with respect to two cases, i.e., the case where the ceramic substrate 22 is not provided with a heat spreader 25 but directly provided with a fin, and the case where the ceramic substrate 22 is provided with a Cu-W heat spreader of a square shape of the size of 1.25"×1.25", (31.8 mm×31.8 mm) and of the thickness of 40 MIL (1.02 mm.).

Figure 14:
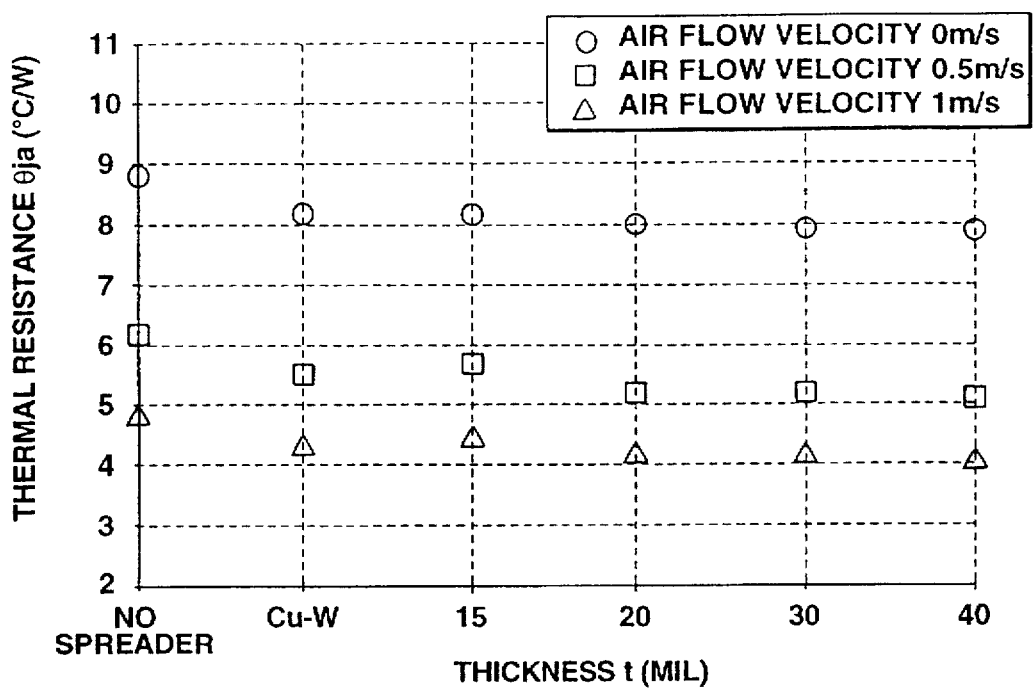
FIG. 14 is a graph of a relation between thickness t of heat radiating member and thermal resistance $\theta_{ja}$ in the package base of FIG. 13B.

The result of measurement of the thermal resistance $\theta_{ja}$ (°C/W) is shown in Table 4 and in FIG. 14.

From Table 4 and FIG. 14, it is seen that there is a tendency that as the thickness of the heat spreader 25 becomes larger the thermal resistance $\theta_{ja}$ is lowered a little. It is considered that this is because as the thickness becomes larger it becomes possible to transfer the heat much more in the heat spreader side surface extending direction, i.e., to the entire heat spreader, so it becomes possible to transfer heat even to the portion adjacent the outer periphery of the heat spreader with efficiency.

TABLE 4

| HEAT SPREADER | | THERMAL RESISTANCE θja (°C/W) | | |
|---|---|---|---|---|
| | | (AVERAGE) AIR FLOW VELOCITY | | |
| MATERIAL | THICKNESS (MIL) | 0 m/s | 0.5 m/s | 1/0 m/s |
| Cu | 15 | 8.2 | 5.7 | 4.4 |
| (OFHC) | 20 | 8.0 | 5.2 | 4.2 |
| | 25 | 7.9 | 5.2 | 4.2 |
| | 30 | 7.9 | 5.1 | 4.0 |
| Cu-W | 40 | 8.2 | 5.5 | 4.3 |
| NOT PROVIDED | — | 8.8 | 6.2 | 4.9 |

*THE NUMBER OF SAMPLES ARE TWO FOR EACH KIND.

However, under either of the conditions with respect to the air flow velocity, the thermal resistance $\theta_{ja}$ does not differ so such from that in the case where the heat spreader made of Cu-W is used. Particularly, in the cases where t=20 MIL, 25 MIL and 30 MIL, the heat spreader exhibits a rather better therirmal resistance $\theta_{ja}$ as compared with the case where the seat spreader made of Cu-W is used. It is considered that this is because the thermal conductivity of copper is considerably higher than that of Cu-W (i.e., 1.9 times larger in this embodiment), so even if the thickness n s small the heat spreader can transfer heat to the fin while transmitting it to a radially expanded area which extends in the direction transversal to the thickness direction of the heat spreader and therefore the heat spreader can radiate heat with efficiency.

Figure 15:
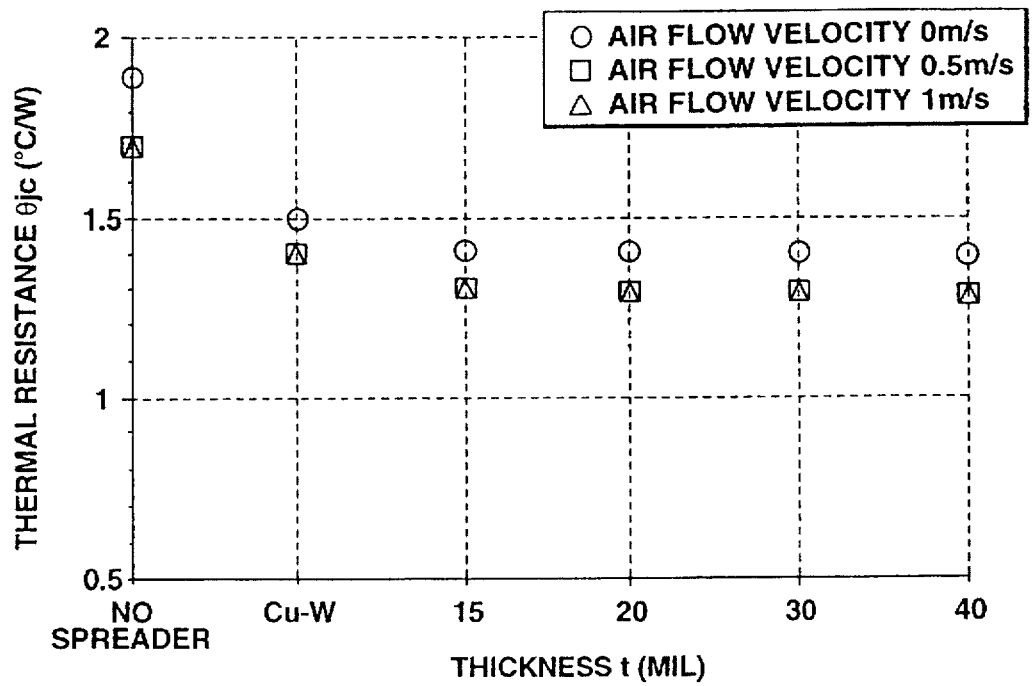
FIG. 15 is a graph of a relation between thickness t of heat radiating member and thermal resistance $\theta_{jc}$ in the package base of FIG. 13B.

The result of measurement of the thermal resistance $\theta_{jc}$ (°C/W) is shown in Table 5 and in FIG. 15.

TABLE 5

| HEAT SPREADER | | THERMAL RESISTANCE θjc (°C/W) | | |
|---|---|---|---|---|
| | | (AVERAGE) AIR FLOW VELOCITY | | |
| MATERIAL | THICKNESS (MIL) | 0 m/s | 0.5 m/s | 1/0 m/s |
| Cu | 15 | 1.4 | 1.3 | 1.3 |
| (OFHC) | 20 | 1.4 | 1.3 | 1.3 |
| | 25 | 1.4 | 1.3 | 1.3 |
| | 30 | 1.4 | 1.3 | 1.3 |
| Cu-W | 40 | 1.5 | 1.4 | 1.4 |

TABLE 5-continued

| HEAT SPREADER | | THERMAL RESISTANCE θjc (°C/W) | | |
|---|---|---|---|---|
| | | (AVERAGE) AIR FLOW VELOCITY | | |
| MATERIAL | THICKNESS (MIL) | 0 m/s | 0.5 m/s | 1/0 m/s |
| NOT PROVIDED | — | 1.9 | 1.7 | 1.7 |

*THE NUMBER OF SAMPLES ARE TWO FOR EACH KIND.

By the result shown in Table 5 and FIG. 15, it is indicated that in the case where a heat spreader made of Cu is used the thermal resistance $\theta_{jc}$ is maintained at the same level irrespective of the thickness t under any air flow velocity. This indicates that the heat spreader produced a noticeable effect so that the heat radiating property had already been put in a condition of being dependent upon the coefficient of heat transfer from the heat radiating fin to the open air.

Further, with any thickness, the heat spreader made of Cu can stand comparison with the heat spreader made of Cu-W and rather has a good thermal resistance. From this, it is indicated that the heat spreader made of copper according to this invention is effective and useful.

In connection with the others, it is revealed from either of the results shown in Tables 4 and 5 and in FIGS. 14 and 15 that a package base having no heat spreader, as a matter of course, was inferior to that having a heat spreader. This is because that without any heat spreader the package base could not transfer heat to a radially expanded area of the heat radiating fin.

From the above, it is confirmed that in the case where oxygen-free copper is used as a material for forming a heat spreader, a heat spreader which can be compared with that made of Cu-W or has an excellent heat radiating property and a high reliability, can be attained by setting its thickness to a value within the range from 0.25~0.76 mm (10~30 MIL), even if the heat spreader is of such a kind having an adhering portion of a large size and having heretofore been considered as being incapable of being put into practical use.

Further, it is apparent that the same result will be obtained with respect to a heat slug as a heat radiating member other than a heat spreader.

In this connection, while in the above described first and second embodiments investigations have been made with respect to a heat spreader as a heat radiating member, which is adhered by brazing at one entire side surface to a ceramic substrate, the heat spreader can otherwise be of the kind having any one of the sections shown in FIGS. 16A to 16E.

In this connection, a thermal expansion difference with respect to the ceramic substrate is caused at a heat spreader portion having a adhering surface "A", so that it will do to make one side of the adhering surface "A" be equal to or larger than 8 mm and the thickness t at the heat spreader portion having the adhering surface "A" be 10~30 MIL.

Figure 16A:
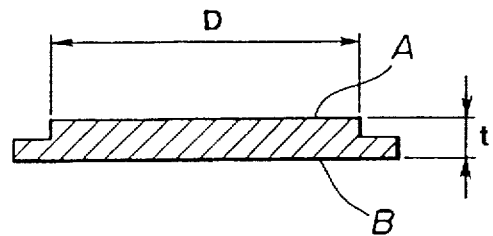
FIGS. 16A to 16B are sectional views of various heat radiating members (heat spreader and heat slug) according to variants of the present invention.
Figure 16B:
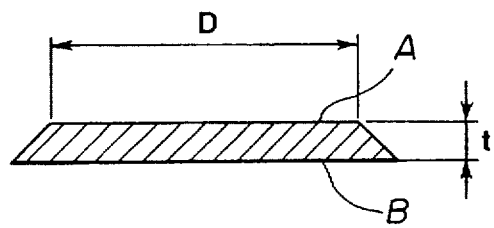
Figure 16C:
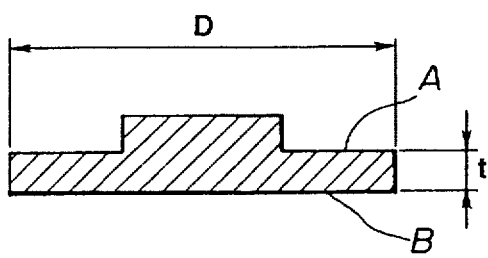
Figure 16D:
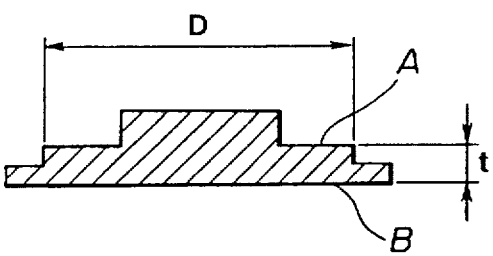
Figure 16E:
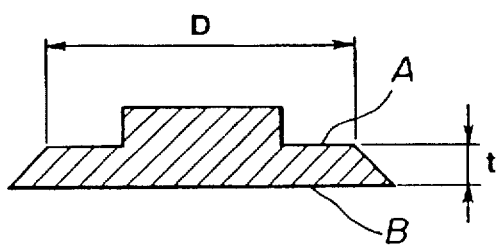

In the meant, me, in FIG. 16, the sections shown in FIGS. 16A and 16E are the shapes applicable to both of a heat spreader and a heat slug, and the heat radiating surface "B" is larger than the adhering surface "A" so that the heat spreader or heat slug can radiate heat with improved efficiency. Further, the sections shown in FIGS. 16C, 16D and 16E are the shapes applicable to a heat slug, among which the sections shown in FIGS. 16D and 16E have heat radiating surfaces "B" larger than adheresing surfaces "A" similarly to those shown in FIGS. 16A and 16B so that they can radiate heat with improved efficiency.

While in the above described embodiments and sample calculations only the case where oxygen-free copper is used as a material for forming a heat radiating member is shown, the material for a heat radiating member is not limited to oxygen-free copper but it can otherwise be, for example, a pure copper material such as so-called electrolytic copper, deoxidized copper, tough pitch copper, etc., or copper of a further high purity, or copper-base dilute alloy such as silver-containing oxygen-free copper (Cu-Ag(0.03–0.25%)) and tin-containing copper (Cu-Sn(0.03–0.3%)) which are pure copper containing a small amount of element. Further, by consideration of the amount of heat generated by an IC chip, etc., a necessitated size of a heat radiating member and others, even a copper material having a low purity and copper alloy such as brass can be used by suitably selecting coefficient of thermal expansion, coefficient of longitudinal elasticity and heat transfer rate. However, pure copper such as oxygen-free copper or tough pitch copper is a material which is widely used and therefore in large quantities, so it is obtainable with ease and inexpensive. Furthermore, the heat transfer rate of such pure copper is high as compared with other copper alloys, so the pure copper is particularly suited to this invention. Use of other materials such as silver, gold, etc. can be considered. However, such materials have a disadvantage that they are expensive.

Further, while in the first and second embodiments investigations were made with respect to the case where the ceramic substrate and the heat radiating member were adhered to each other by brazing by use of a eutectic silver brazing metal by way of a metallized layer provided to the ceramic substrate, a method of adhering the neat radiating member to the ceramic substrate is not limited to such brazing. For example, such adherence can be attained by other brazing by use of a brazing metal having a different composition or by a DBC method which is a direct bonding method by use of eutectic reaction of Cu-O.

However, such adherence (joining) that is carried out at low temperature, i.e., adherence of the kind in which the heat applied to the ceramic substrate aid the heat radiating member at the time of adherence is equal to or lower than 500° C., such as soldering by use of Au-Si, Au-Sn, etc., and bonding by use of epoxy, polyimide, or the like, is undesirable. This is because, although such adherence at low temperature is desirable from the point of view that the difference in thermal expansion between the ceramic substrate and the heat radiating member becomes smaller, there is caused a problem of restriction of the heating temperature in the process for attaching an IC chip to a package and sealing the package needs to be restricted, removal of the heat radiating member, etc.

In the first and second embodiments, a ceramic substrate formed from a ceramic material mainly containing alumina is used. However, the present invention can be applicable to the case where a ceramic material having a coefficient of thermal expansion which is equal to or smaller than $8.5 \times 10^{-6}/K$ is used for the ceramic substrate. The present invention prevents a crack or cracks from being caused in the ceramic substrate due to a difference in thermal expansion between the ceramic substrate and the heat radiating member, so it is not of the purpose of this invention to limit the material of the ceramic substrate to alumina since this invention can produce substantially the same effect even in the chase where the coefficient of thermal expansion of the ceramic substrate is small.

Enumerated as examples of the ceramic material are, other than alumina, mullite, glass ceramic, aluminum nitride (AlN), silicon carbide (SiC), silicon nitride (Si3N4) and cordierite, and a ceramic material prepared by suitable mixing of those materials can also be used.

While in the first and second embodiments investigations were made to a PCA type ceramic package as a package base, in which a plurality of outlet terminals each of which is in the form of a pin are provided to the ceramic substrate, the present invention can be applied to any type ceramic base such as one for a BGA (Ball Grid Array) type having a plurality of outlet terminals each of which is in the form a ball, a DIP type having a plurality of outlet terminals projecting from the side surfaces of the package base, a QFP type and a MCM (Multi-Chip Module) type, provided that the package base has adhered thereto a heat radiating member.

Figure 17:
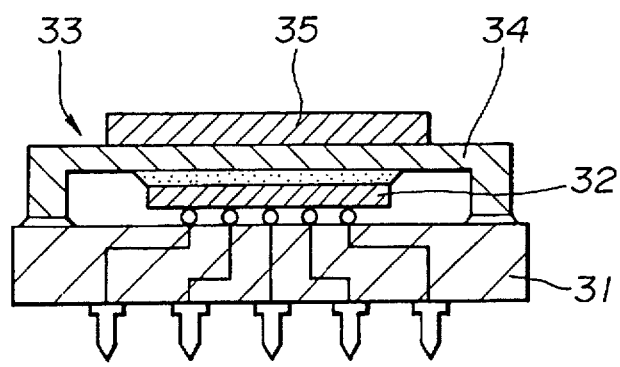
FIG. 17 is a sectional view of a ceramic package cover according to a further embodiment of the present invention.

Further, the present invention can be applied to the case where, as shown in FIG. 17, the terminal connection between an IC chip 32 and a package base 31 is performed by a flip chip method (C4 technique) and the IC chip 32 is hermetically closed by means of a ceramic cap or cover 33 made up of a ceramic substrate 34 and a heat radiating member 35 adhered thereto.

The heat radiating From the IC chip 32 is transferred to the ceramic substrate 34 to which the IC chip 32 is adhered, and then radiated from the heat radiating member 35 directly to the open air or further through a heat radiating fin (not shown) adhered to the heat radiating member 35. It is apparent that the present invention is also applicable to this case.

That is, in the case where the heat radiating member 35 is adhered by brazing or the like to the ceramic substrate 34, the heat radiating member, if copper is used as a material for forming the adhering portion of the heat radiating member 35 and the thickness of the heat radiating member 35 is set to be within the range 10–30 MIL, can have a heat radiating property that can be compared with that of the heat radiating member made of Cu-W and a high reliability.

From the foregoing description, it will be understood that according to the present invention it becomes possible to provide an IC ceramic package base which is easy in design, has a high reliability and durability and has adhered thereto a heat radiating member having an excellent heat radiating property, even in the case where a heat radiating member used for the ceramic IC package base has a large adhering area so that it has heretofore been believed that the ceramic IC package base having the heat radiating member with such a large adhering area cannot be put into practical use or in the case where the ceramic IC package base is of the type in which the ceramic substrate has a recess or through hole for adherence of an IC chip. By this, it becomes possible to provide a ceramic IC package base in which a heat radiating member made of inexpensive copper or copper alloy is used in place of a heat radiating member made of expensive Cu-W.

Further, the present invention makes it possible to provide a ceramic IC package cover having the same effect as above.

What is claimed is:

1. A ceramic IC package base comprising:
   a ceramic substrate; and
   a heat radiating member directly adhered to a side surface of said ceramic substrate by brazing through a metallized layer or by DBC, wherein said heat radiating member is made of one or more of copper and copper containing a small amount of another element;
   said heat radiating member having an adhering portion at which it is directly adhered to said ceramic substrate by said brazing or DBC;

wherein said adhering portion, when said heat radiating member is observed in a plan view, has one side which is equal to or larger than 8 mm, and said adhering portion is of the thickness within the range from 0.25 mm to 0.76 mm.

2. A ceramic IC package base according to claim 1, wherein a material of said ceramic substrate has a coefficient of thermal expansion α which is given by
$\alpha \leq 8.5 \times 10^{-6}/K$.

3. A ceramic IC package base according to claim 1, wherein said ceramic substrate is made of at one or more ceramic materials selected from the group consisting of alumina, mullite, glass ceramic, aluminum nitride (AlN), silicon carbide (SiC), silicon nitride ($Si_3N_4$) and cordierite.

4. A ceramic IC package base according to claim 1, wherein said ceramic substrate has formed thereon said metallized layer, and said heat radiating member is directly adhered by brazing to said metallized layer.

5. A ceramic IC package base according to claim 1, wherein said heat radiating member is directly adhered to said ceramic substrate by means of a DBC method.

6. A ceramic IC package base according to claim 1, wherein the heat radiating member is made of copper.

7. A ceramic IC package base according to claim 1, wherein the copper containing a small amount of another element is one or more of silver-containing oxygen free copper and tin-containing copper.

8. A ceramic IC package base according to claim 6, wherein the copper is one or more of oxygen-free copper, electrolytic copper, deoxidized copper and tough pitch copper.

9. A ceramic IC package base comprising:
a ceramic substrate having an IC chip attaching portion; and
a heat radiating member directly adhered to a rear surface of said ceramic substrate opposite to said IC chip attaching portion by brazing through a metallized layer or by DBC;
said heat radiating member having an adhering portion at which it is directly adhered to said ceramic substrate;
wherein said heat radiating member is made of one or more of copper and copper containing a small amount of another element, said adhering portion, when said heat radiating member is observed in a plan view, has one side which is equal to or larger than 8 mm, and said adhering portion is of the thickness within the range from 0.25 mm to 0.76 mm.

10. A ceramic IC package base according to claim 9, wherein said ceramic substrate is formed with a recess, and said IC chip attaching portion is formed by a bottom of said recess.

11. A ceramic IC package base according to claim 9, wherein a material of said ceramic substrate has a coefficient of thermal expansion α which is given by
$\alpha \leq 8.5 \times 10^{-6}/K$.

12. A ceramic IC package base according to claim 9, wherein said ceramic substrate is made of at one or more ceramic materials selected from the group consisting of alumina, mullite, glass ceramic, aluminum nitride (AlN), silicon carbide (SiC), silicon nitride ($Si_3N_4$) and cordierite.

13. A ceramic IC package base according to claim 9, wherein said ceramic substrate has formed thereon said metallized layer, and said heat radiating member is directly adhered by brazing to said metallized layer.

14. A ceramic IC package base according to claim 9, wherein said heat radiating member is directly adhered to said ceramic substrate by means of a DBC method.

15. A ceramic IC package base according to claim 9, wherein the heat radiating member is made of copper.

16. A ceramic IC package base according to claim 9, wherein the copper containing a small amount of another element is one or more of silver-containing oxygen free copper and tin-containing copper.

17. A ceramic IC package base according to claim 15, wherein the copper is one or more of oxygen-free copper, electrolytic copper, deoxidized copper and tough pitch copper.

18. A ceramic IC package base comprising:
a ceramic substrate having a through hole;
a heat radiating member directly adhered to a side surface of said ceramic substrate by brazing through a metallized layer or by DBC, in such a manner as to close said through hole;
said heat radiating member having an adhering portion at which it is directly adhered to said ceramic substrate;
wherein said heat radiating member is made of one or more of copper and copper containing a small amount of another element, said adhering portion, when said heat radiating member is observed in a plan view, has one side which is equal to or larger than 8 mm, and said adhering portion is of the thickness within the range from 0.25 mm to 0.76 mm.

19. A ceramic IC package base according to claim 18, wherein a material of said ceramic substrate has a coefficient of thermal expansion α which is given by
$\alpha \leq 8.5 \times 10^{-6}/K$.

20. A ceramic IC package base according to claim 18, wherein said ceramic substrate is made of at one or more ceramic materials selected from the group consisting of alumina, mullite, glass ceramic, aluminum nitride (AlN), silicon carbide (SiC), silicon nitride ($Si_3N_4$) and cordierite.

21. A ceramic IC package base according to claim 18, wherein said ceramic substrate has formed thereon said metallized layer, and said heat radiating member is directly adhered by brazing to said metallized layer.

22. A ceramic IC package base according to claim 18, wherein said heat radiating member is directly adhered to said ceramic substrate by means of a DBC method.

23. A ceramic IC package base according to claim 18, wherein the heat radiating member is made of copper.

24. A ceramic IC package base according to claim 18, wherein the copper containing a small amount of another element is one or more of silver-containing oxygen free copper and tin-containing copper.

25. A ceramic IC package base according to claim 23, wherein the copper is one or more of oxygen-free copper, electrolytic copper, deoxidized copper and tough pitch copper.

26. A ceramic IC package cover comprising:
a ceramic substrate having an IC chip attaching portion; and
a heat radiating member directly adhered to a rear surface of said ceramic substrate opposite to said IC chip attaching portion by brazing through a metallized layer or by DBC;
said heat radiating member having an adhering portion at which it is directly adhered to said ceramic substrate;
wherein said heat radiating member is made of one or more of copper and copper containing a small amount of another element, said adhering portion when said heat radiating member is observed in a plan view, has one side which is equal to or larger than 8 mm, and said adhering portion is of the thickness within the range from 0.25 mm to 0.76 mm.

27. A ceramic IC package base according to claim 26, wherein the heat radiating member is made of copper.

28. A ceramic IC package base according to claim 26, wherein the copper containing a small amount of another element is one or more of silver-containing oxygen free copper and tin-containing copper.

29. A ceramic IC package base according to claim 27, wherein the copper is one or more of oxygen-free copper, electrolytic copper, deoxidized copper and tough pitch copper.

30. A ceramic IC package base comprising:

a ceramic substrate having a thermal expansion coefficient of 2.0 to $8.5 \times 10^{-6}$/K; and a heat radiating member plate made substantially of copper plate having a heat radiating surface, having a thickness more than 0.3 mm and having an adhering portion which includes an adhering surface to which said substrate is directly adhered by brazing through a metallized layer or by DBC;

wherein said adhering portion has a thickness ranging from 0.25 mm to 0.76 mm and has a length that is equal to or larger than 8 mm in a side of said adhering portion when said radiating member plate is observed in a plan view of said radiating portion; and wherein said ceramic substrate has a residual stress that is lower than about 10 kgf/mm$^2$ in the ceramic substrate by virtue of the brazing.

31. A ceramic package base according to claim 30, wherein said heat radiating surface is larger than said adhering surface.

32. A ceramic IC package base according to claim 30, further comprising an IC chip attaching portion formed on a surface which is parallel with said heat radiating surface.

33. A ceramic IC package base according to claim 32, further comprising a recess formed in said ceramic substrate, and said IC chip attaching portion is formed on a recessed surface formed by the recess.

34. A ceramic IC package based according to claim 30, wherein said residual stress is lower than about 5 kgf/mm$^2$.

35. A ceramic IC package base according to claim 30, further comprising a through hole formed in said ceramic substrate so that a surface of said copper plate is exposed in said hole.

36. A ceramic IC package cover comprising:

a ceramic substrate that has a thermal expansion coefficient of 2.0 to $8.5 \times 10^{-6}$/K; and a plate made substantially of copper that is a heat radiating member having a thickness more than 0.3 mm, and includes an adhering portion having an adhering surface to which said substrate is directly adhered by brazing through a metallized layer or by DBC;

wherein said adhering portion has a thickness ranging from 0.25 mm to 0.76 mm and a length that is equal to or larger than 8 mm in a side of the said adhering portion when said radiating member is observed in a plan view of said radiating member; and wherein said ceramic substrate has a thermal residual stress that is lower than about 10 kgf/mm$^2$ by virtue of the brazing or the DBC.

37. A ceramic IC package cover according to claim 36, wherein said residual stress is lower than about 5 kgf/mm$^2$.

* * * * *